US008624353B2

(12) United States Patent
Lin et al.

(10) Patent No.: US 8,624,353 B2
(45) Date of Patent: Jan. 7, 2014

(54) SEMICONDUCTOR DEVICE AND METHOD OF FORMING INTEGRATED PASSIVE DEVICE OVER SEMICONDUCTOR DIE WITH CONDUCTIVE BRIDGE AND FAN-OUT REDISTRIBUTION LAYER

(75) Inventors: Yaojian Lin, Singapore (SG); Kai Liu, Phoenix, AZ (US); Kang Chen, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 3 days.

(21) Appl. No.: 13/311,266

(22) Filed: Dec. 5, 2011

(65) Prior Publication Data

US 2012/0161279 A1 Jun. 28, 2012

Related U.S. Application Data

(60) Provisional application No. 61/426,186, filed on Dec. 22, 2010.

(51) Int. Cl.
*H01L 27/08* (2006.01)
*H01L 21/02* (2006.01)

(52) U.S. Cl.
USPC ............................ 257/531; 257/532; 257/535

(58) Field of Classification Search
USPC .......................................... 257/531, 532, 535
See application file for complete search history.

(56) References Cited

U.S. PATENT DOCUMENTS

| | | | | |
|---|---|---|---|---|
| 7,811,919 | B2 * | 10/2010 | Daley et al. | 438/597 |
| 7,816,792 | B2 | 10/2010 | Tews et al. | |
| 7,986,023 | B2 | 7/2011 | Tews et al. | |
| 8,169,050 | B2 * | 5/2012 | Daley et al. | 257/531 |
| 8,232,622 | B2 * | 7/2012 | Urakawa | 257/531 |
| 8,471,357 | B2 * | 6/2013 | Huang et al. | 257/531 |
| 2006/0163694 | A1 * | 7/2006 | Ohguro | 257/531 |
| 2008/0012091 | A1 * | 1/2008 | Ding et al. | 257/531 |
| 2008/0042236 | A1 * | 2/2008 | Seah | 257/531 |
| 2008/0290457 | A1 * | 11/2008 | Ker et al. | 257/531 |
| 2008/0308917 | A1 | 12/2008 | Pressel et al. | |
| 2009/0322447 | A1 * | 12/2009 | Daley et al. | 333/185 |
| 2010/0006978 | A1 * | 1/2010 | Nakashiba | 257/531 |
| 2010/0052096 | A1 * | 3/2010 | Urakawa | 257/531 |
| 2011/0062549 | A1 | 3/2011 | Lin | |
| 2011/0169130 | A1 * | 7/2011 | Uchida | 257/531 |
| 2011/0204509 | A1 | 8/2011 | Lin et al. | |
| 2011/0316118 | A1 * | 12/2011 | Uchida et al. | 257/531 |
| 2012/0187532 | A1 * | 7/2012 | Uchida | 257/531 |
| 2012/0267756 | A1 * | 10/2012 | Shi et al. | 257/531 |
| 2013/0147011 | A1 * | 6/2013 | Okushima et al. | 257/531 |

* cited by examiner

*Primary Examiner* — Ngan Ngo

(74) *Attorney, Agent, or Firm* — Robert D. Atkins; Patent Law Group: Atkins & Associates, P.C.

(57) ABSTRACT

A semiconductor device has a first semiconductor die. A first inductor is formed over the first semiconductor die. A second inductor is formed over the first inductor and aligned with the first inductor. An insulating layer is formed over the first semiconductor die and the first and second inductors. A conductive bridge is formed over the insulating layer and electrically connected between the second inductor and the first semiconductor die. In one embodiment, the semiconductor device has a second semiconductor die and a conductive layer is formed between the first and second semiconductor die. In another embodiment, a capacitor is formed over the first semiconductor die. In another embodiment, the insulating layer has a first thickness over a footprint of the first semiconductor die and a second thickness less than the first thickness outside the footprint of the first semiconductor die.

30 Claims, 26 Drawing Sheets

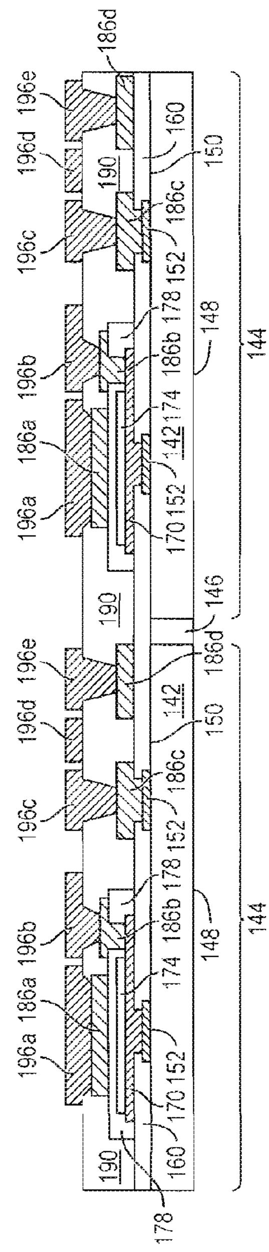
FIG. 4h
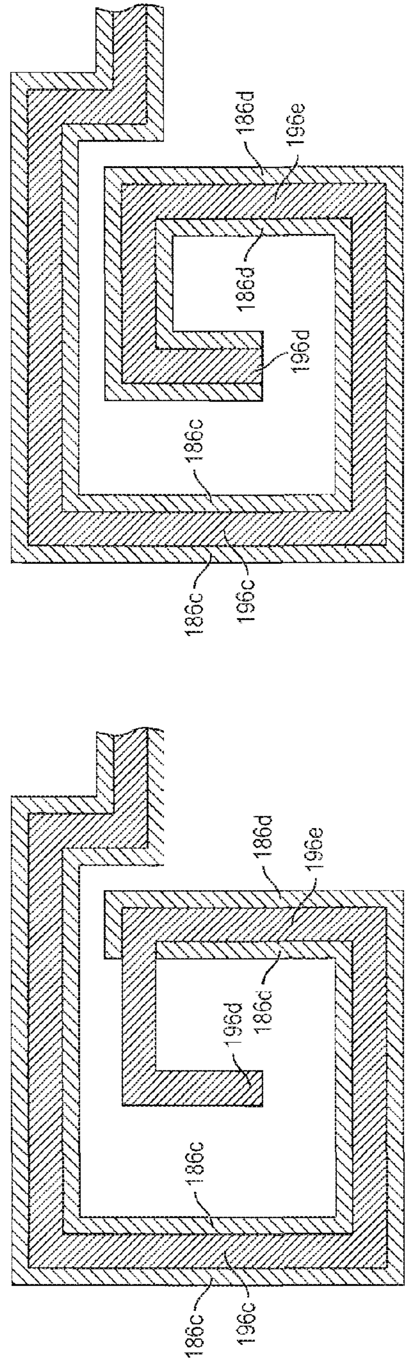
FIG. 4i
FIG. 4j

SEMICONDUCTOR DEVICE AND METHOD OF FORMING INTEGRATED PASSIVE DEVICE OVER SEMICONDUCTOR DIE WITH CONDUCTIVE BRIDGE AND FAN-OUT REDISTRIBUTION LAYER

CLAIM TO DOMESTIC PRIORITY

The present application claims the benefit of Provisional Application No. 61/426,186, filed Dec. 22, 2010, and claims priority to the above application pursuant to 35 U.S.C. §119 (e).

FIELD OF THE INVENTION

The present invention relates in general to semiconductor devices and, more particularly, to a semiconductor device and method of forming an integrated passive device over and electrically connected to a semiconductor die with a conductive bridge and fan-out redistribution layer.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CODs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. However, high frequency electrical devices generate or are susceptible to undesired electromagnetic interference (EMI) and radio frequency interference (RFI), harmonic distortion, or other inter-device interference, such as capacitive, inductive, or conductive coupling, also known as cross-talk, which can interfere with their operation.

In a conventional fan-out wafer level chip scale package (Fo-WLCSP), IPDs are commonly formed externally to semiconductor die within the Fo-WLCSP. The process of forming IPDs externally to semiconductor die, however, carries a significant manufacturing cost, particularly for high current applications. Additionally, the process of forming IPDs externally to semiconductor die is prone to cause some degree of misalignment, which can degrade the quality and reliability of the IPDs, particularly when the IPDs are formed over semiconductor die and also separately during subsequent formation of redistribution layers (RDLs). Furthermore, leakage current between IPDs and electrically conductive RDLs can occur, particularly in high current applications, which reduces the reliability and functionality of the semiconductor package.

SUMMARY OF THE INVENTION

A need exists to produce a reliable and cost-effective semiconductor package with aligned IPDs formed externally to a semiconductor die and low leakage current. Accordingly, in one embodiment, the present invention is a method of making a semiconductor device comprising the steps of providing a first semiconductor die, forming a first inductor over the first semiconductor die, forming a second inductor over the first inductor and aligned with the first inductor, forming an insulating layer over the first semiconductor die and the first and second inductors, and forming a conductive bridge over the insulating layer and electrically connected between the second inductor and the first semiconductor die.

In another embodiment, the present invention is a method of making a semiconductor device comprising the steps of providing a first semiconductor die, forming a first inductor over the first semiconductor die, and forming a second inductor over the first inductor and aligned with the first inductor.

In another embodiment, the present invention is a method of making a semiconductor device comprising the steps of providing a first semiconductor die, forming a plurality of integrated passive devices (IPDs) over the first semiconductor die, forming an insulating layer over the first semiconductor die and the IPDs, and forming a conductive bridge over the insulating layer and electrically connected between the IPDs and the first semiconductor die.

In another embodiment, the present invention is a semiconductor device comprising a first semiconductor die. A first inductor is formed over the first semiconductor die. A second inductor is formed over the first inductor and aligned with the first inductor. An insulating layer is formed over the first semiconductor die and the first and second inductors. A conductive bridge is formed over the insulating layer and electrically connected between the second inductor and the first semiconductor die.

BRIEF DESCRIPTION OF THE DRAWINGS

FIGS. 4*a*-4*l* illustrate a process of forming IPDs over a semiconductor die;

DETAILED DESCRIPTION OF THE DRAWINGS

Figure 1:
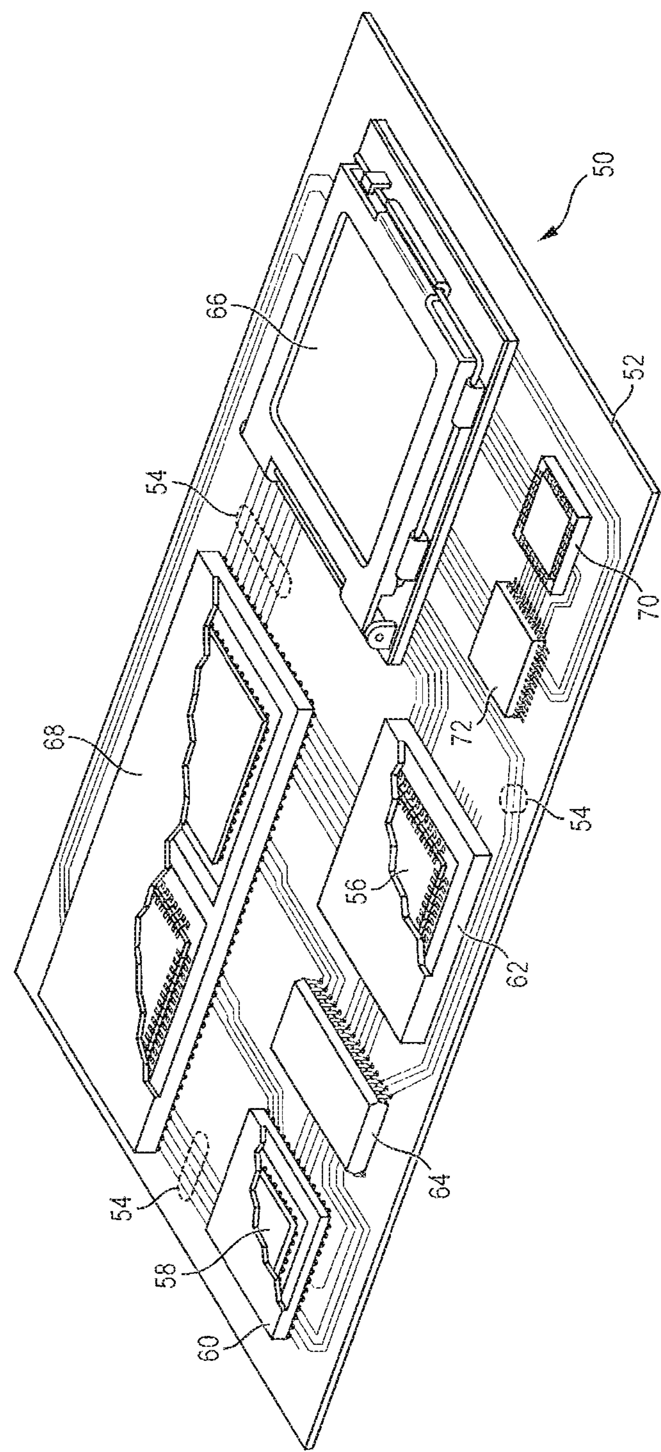
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, i.e., the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography.

Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
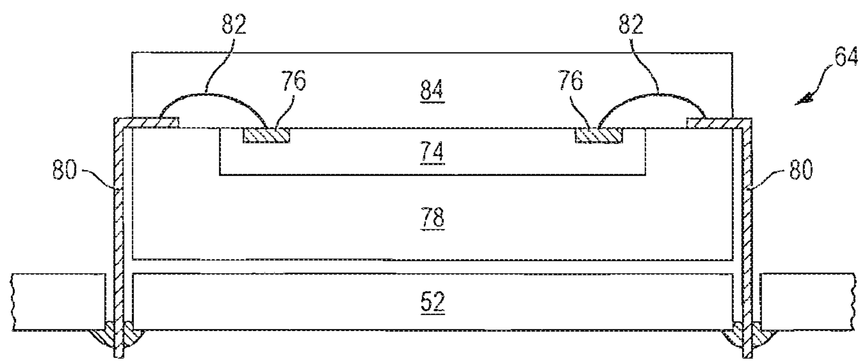
FIGS. 2*a*-2*c* illustrate further detail of the representative semiconductor packages mounted to the PCB.
Figure 2B:
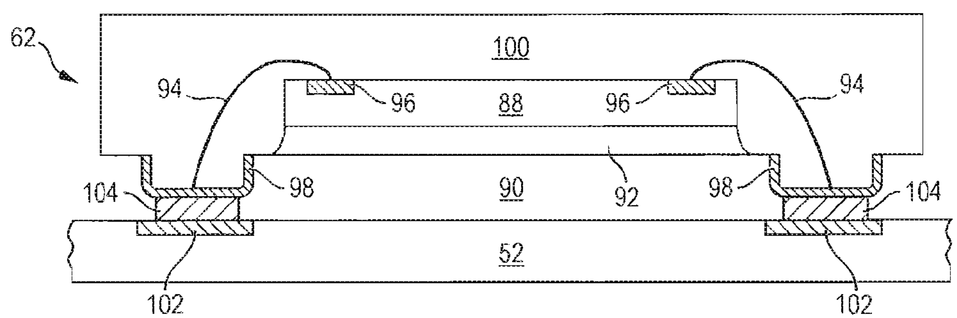
Figure 2C:
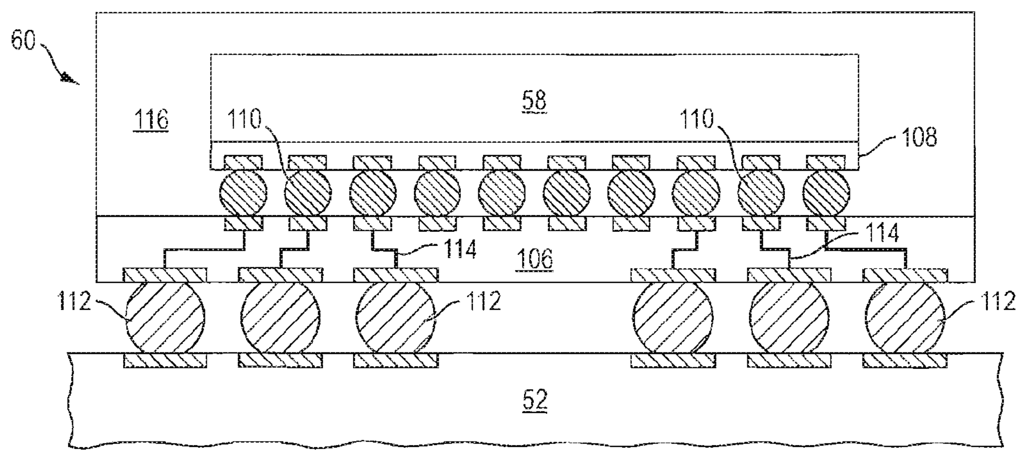

FIGS. 2*a*-2*c* show exemplary semiconductor packages. FIG. 2*a* illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2*b* illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2*c*, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
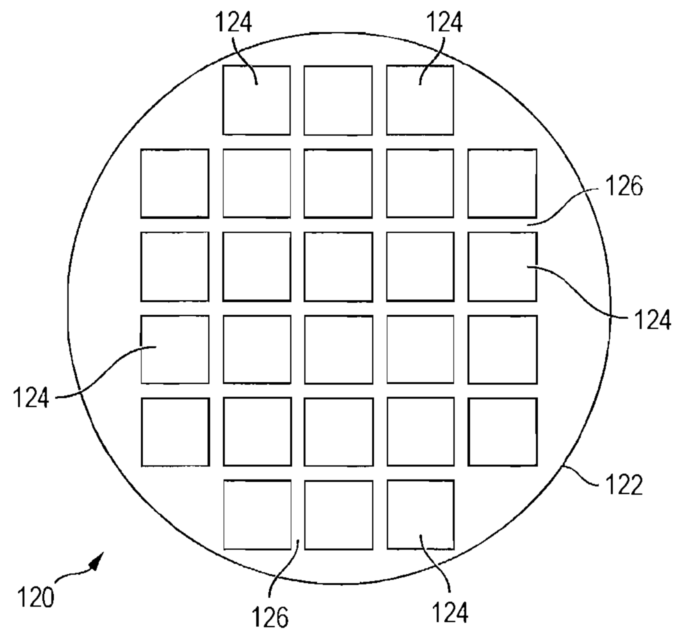
FIGS. 3*a*-3*c* illustrate a semiconductor wafer with a plurality of semiconductor die separated by a saw street.

FIG. 3*a* shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
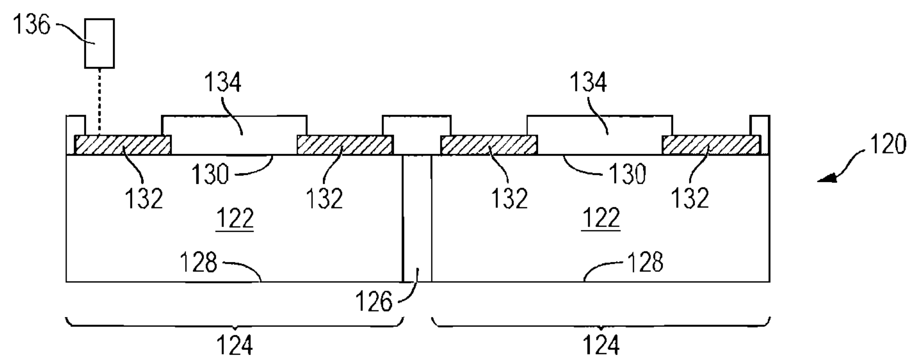

FIG. 3*b* shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain IPDs, such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be disposed side-by-side a first distance from the edge of semiconductor die 124, as shown in FIG. 3*b*. Alternatively, conductive layer 132 can be offset in multiple rows such that a first row of contact pads is disposed a first distance from the edge of the die, and a second row of contact pads alternating with the first row is disposed a second distance from the edge of the die.

An insulating or passivation layer 134 is formed over active surface 130 and conductive layer 132 using PVD, CVD, screen printing, spin coating, spray coating, sintering or thermal oxidation. The insulating layer 134 contains one or more layers of silicon dioxide (SiO2), silicon nitride (Si3N4), silicon oxynitride (SiON), tantalum pentoxide (Ta2O5), aluminum oxide (Al2O3), organic polymer, or other material having similar insulating and structural properties. A portion of insulating layer 134 is removed by an etching process with a patterned photoresist layer, to expose conductive layer 132. Alternatively, a portion of insulating layer 134 is removed by laser direct ablation (LDA) using laser 136 to expose conductive layer 132.

Figure 3C:
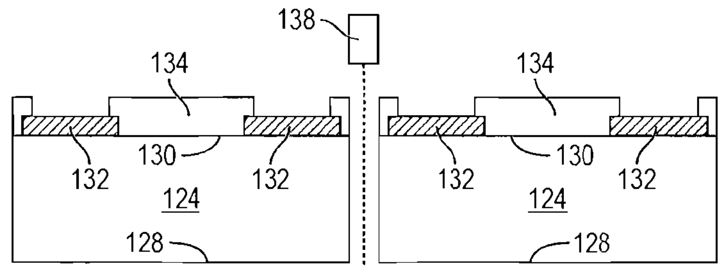

In FIG. 3*c*, semiconductor wafer 120 is singulated through saw street 126 and insulating layer 134 using a saw blade or laser cutting tool 138 into individual semiconductor die 124.

Figure 4A:
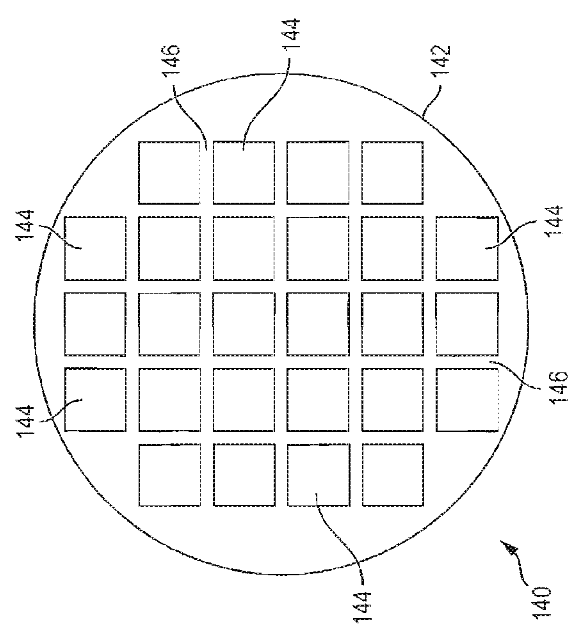

FIG. 4*a* shows a semiconductor wafer 140 with a base substrate material 142, such as silicon, germanium, gallium arsenide, indium phosphide, or silicon carbide, for structural support. A plurality of semiconductor die or components 144 is formed on wafer 140 separated by a non-active, inter-die wafer area or saw street 146 as described above. Saw street 146 provides cutting areas to singulate semiconductor wafer 140 into individual semiconductor die 144.

Figure 4B:
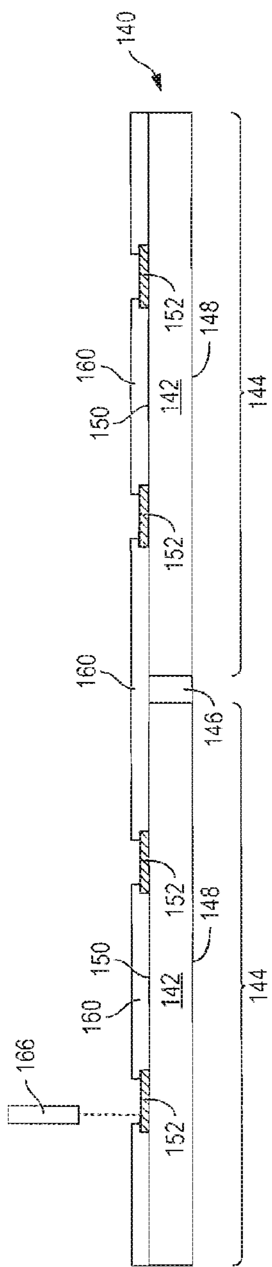

FIG. 4*b* shows a cross-sectional view of a portion of semiconductor wafer 140. Each semiconductor die 144 has a back surface 148 and active surface 150 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 150 to implement analog circuits or digital circuits, such as DSP, ASIC, memory, or other signal processing circuit. Semiconductor die 144 may also contain IPDs, such as inductors, capacitors, and resistors, for RF signal processing.

An electrically conductive layer 152 is formed over active surface 150 using PVD, CVD, electrolytic plating, electroless plating process, or other suitable metal deposition process. Conductive layer 152 can be one or more layers of Al, Cu, Sn, Ni, Au, Ag, or other suitable electrically conductive material. Conductive layer 152 operates as contact pads electrically connected to the circuits on active surface 150. Conductive layer 152 can be disposed side-by-side a first distance from the edge of semiconductor die 144, as shown in FIG. 4*b*. Alternatively, conductive layer 152 can be offset in multiple rows such that a first row of contact pads is disposed a first distance from the edge of the die, and a second row of contact pads alternating with the first row is disposed a second distance from the edge of the die.

An insulating or passivation layer 160 is formed over active surface 150 and conductive layer 152 using PVD, CVD, screen printing, spin coating, spray coating, sintering or thermal oxidation. The insulating layer 160 contains one or more layers of SiO2, Si3N4, SiON, Ta2O5, Al2O3, organic polymer, or other material having similar insulating and structural properties. A portion of insulating layer 160 is removed by an etching process with a patterned photoresist layer to expose conductive layer 152. Alternatively, a portion of insulating layer 160 is removed by LDA using laser 166 to expose conductive layer 152.

Figure 4C:
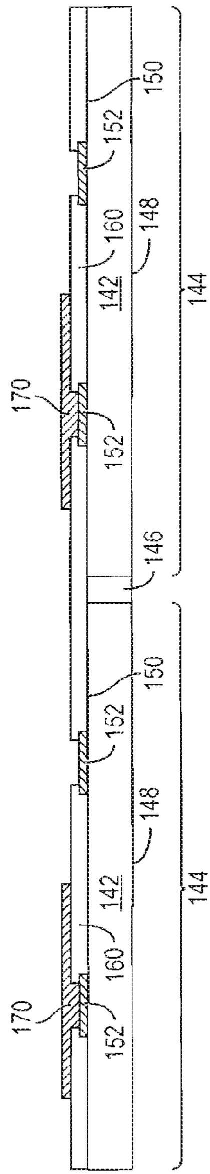

In FIG. 4*c*, an electrically conductive layer 170 is formed over insulating layer 160 and conductive layer 152 using patterning with PVD, CVD, sputtering, electrolytic plating, electroless plating process, or other suitable metal deposition process. Conductive layer 170 can be one or more layers of Al, Cu, Sn, Ni, Au, Ag, or other suitable electrically conductive material. Conductive layer 170 is electrically connected to conductive layer 152.

Figure 4D:
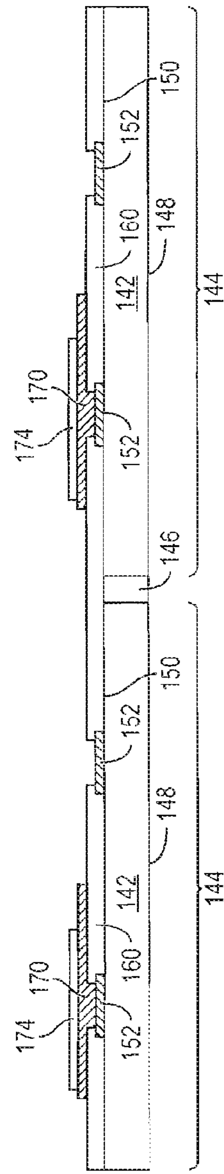

In FIG. 4*d*, a resistive layer 174 is formed over conductive layer 170 using PVD, CVD, or other suitable deposition process. In one embodiment, resistive layer 174 can be tantalum silicide (TaxSiy) or other metal silicides, TaN, nickel chromium (NiCr), titanium (Ti), titanium nitride (TiN), titanium tungsten (TiW), or doped poly-silicon having a resistivity between 1-200 Ohm/square.

Figure 4E:
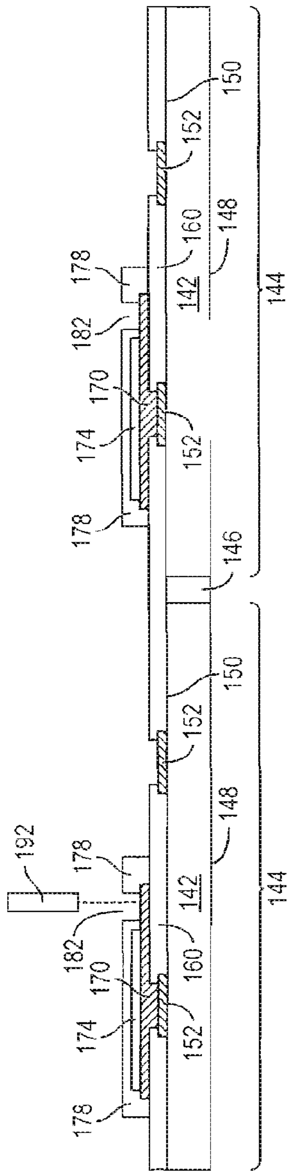

In FIG. 4*e*, an insulating or dielectric layer 178 is formed over resistive layer 174, conductive layer 170, and insulating layer 160. Insulating layer 178 contains one or more layers of SiO2, Si3N4, SiON, Ta2O5, Al2O3, polyimide (PI), benzocyclobutene (BCB), polybenzoxazoles (PBO), or other material having similar insulating and structural properties. In one embodiment, insulating layer 178 acts as a capacitor dielectric material. A portion of insulating layer 178 is removed by an etching process with a patterned photoresist layer, to create opening 182 and expose a portion of conductive layer 170. Alternatively, a portion of insulating layer 178 is removed by LDA using laser 192 to expose a portion of conductive layer 170 and to create opening 182.

Figure 4F:
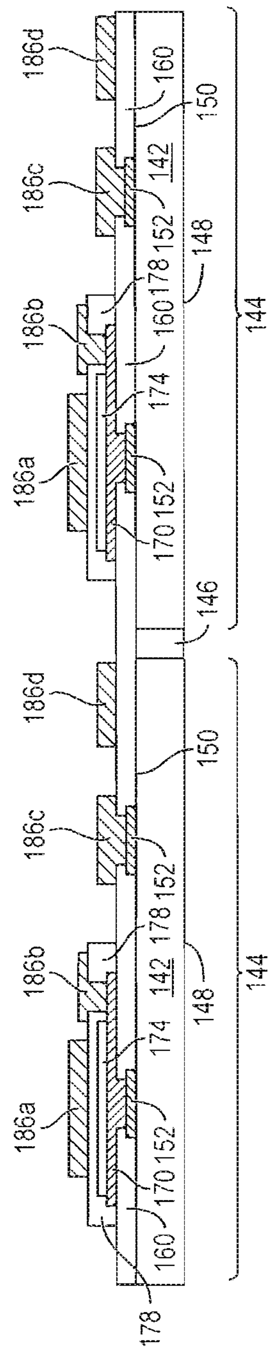

In FIG. 4*f*, an electrically conductive layer 186 is formed over insulating layer 178, conductive layer 170, insulating layer 160, and conductive layer 152 using patterning with PVD, CVD, sputtering, electrolytic plating, electroless plating process, or other suitable metal deposition process to form individual portions or sections 186*a*-186*d*. Conductive layer 186 includes one or more layers of Al, Cu, Sn, Ni, Au, Ag, or other suitable electrically conductive material. In one embodiment, conductive layer 186 is deposited using a suitable selective copper plating process, such as ion milling or back sputtering, with a suitable seed alloy such as titanium copper (TiCu), titanium tungsten copper (TiWCu), or tantalum nitrogen copper (TaNCu). In another embodiment, conductive layer 186 has a thickness between 3 and 15 micrometers (μm).

The individual portions of conductive layer 186*a*-186*d* can be electrically common or electrically isolated according to the design and function of the individual semiconductor die 144. In one embodiment, conductive layer 170, resistive layer 174, insulating layer 178, and conductive layer 186*a* form a metal insulator metal (MIM) capacitor. A portion of conductive layer 186*b* extends vertically through opening 182 to electrically connect conductive layer 186*b* to conductive layer 170. Conductive layer 186*c* is electrically connected to conductive layer 152. The individual sections of conductive layer 186*c* and 186*d* can be wound or coiled in plan-view to produce or exhibit the desired characteristics of an inductor. Conductive layers 186*c*-186*d* form a bottom inductor wing formed over and within a footprint of semiconductor die 144.

Figure 4G:
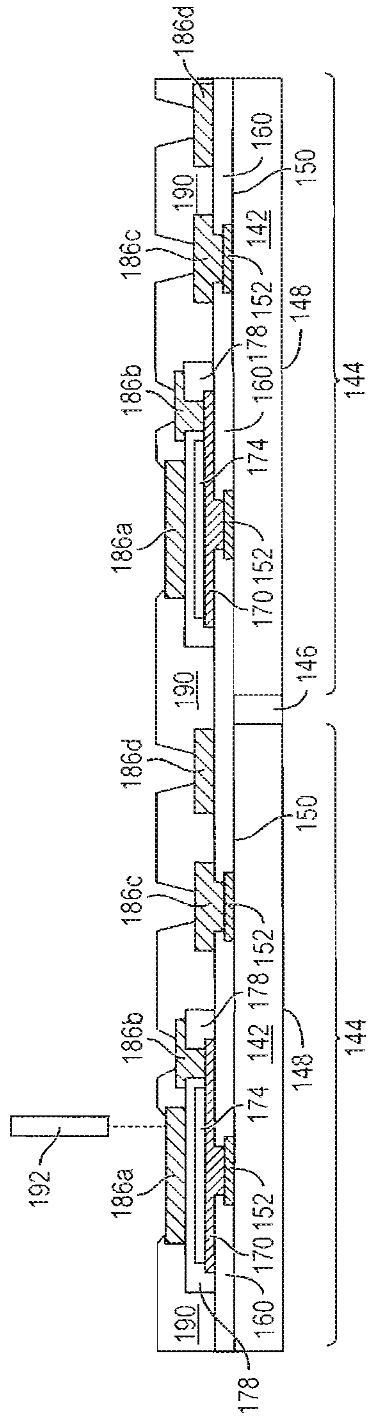

In FIG. 4*g*, an insulating or passivation layer 190 is formed over conductive layer 186, insulating layer 178, and insulating layer 160 using PVD, CVD, printing, spin coating, spray coating, screen printing or lamination. Insulating layer 190 contains one or more layers of SiO2, Si3N4, SiON, Ta2O5, Al2O3, organic polymer, or other material having similar insulating and structural properties. In one embodiment, insulating layer 190 undergoes a curing process after being deposited, with a curing temperature ranging between 165-380 degrees Celsius (° C.). In another embodiment, a thickness of insulating layer 190 ranges between 5-20 μm. A portion of insulating layer 190 is removed by an etching process with a patterned photoresist layer to expose conductive layer 186. Alternatively, a portion of insulating layer 190 is removed by LDA using laser 192 to expose conductive layer 186.

In FIG. 4*h*, an electrically conductive layer 196 is formed over insulating layer 190 and conductive layer 186 using patterning with PVD, CVD, sputtering, electrolytic plating, electroless plating process, or other suitable metal deposition process to form individual portions or sections 196*a*-196*e*. Conductive layer 196 includes one or more layers of Al, Cu, Sn, Ni, Au, Ag, or other suitable electrically conductive material.

In one embodiment, conductive layer 196 is deposited using a suitable selective copper plating process, such as ion milling or back sputtering, with a suitable seed alloy such as TiCu, TiWCu, or TaNC. In another embodiment, conductive layer 196 has a thickness between 3 and 15 μm.

The individual portions of conductive layer 196*a*-196*e* can be electrically common or electrically isolated according to the design and function of the individual semiconductor die 144. Conductive layer 196*a* is electrically connected to and aligned with conductive layer 186*a*. Conductive layer 196*b* is electrically connected to and aligned with conductive layer 186*b*. Conductive layer 196*c* is electrically connected to and aligned with conductive layer 186*c*. Conductive layer 196*e* is electrically connected to and aligned with conductive layer 186*d*. The individual sections of conductive layer 196*c*-196*e* can be wound or coiled in plan-view to produce or exhibit the desired characteristics of an inductor. Conductive layers 196*c*-196*e* form a top inductor wing formed over and within a footprint of semiconductor die 144.

FIG. 4*i* shows a plan view of the footprint of the top and bottom inductor wings shown in FIG. 4*h*. In one embodiment, shown in FIG. 4*i*, conductive layers 196*c*-196*e* have a smaller cross sectional width than conductive layers 186*c*-186*d*. The cross sectional widths of conductive layers 196*c*-196*e* and conductive layers 186*c*-186*d* can vary, according to the design and functionality of semiconductor die 144. In another embodiment, conductive layers 196*c*-196*e* have a cross sectional width that is greater than or equal to the cross sectional width of conductive layers 186*c*-186*d*.

The top inductor wing 196*c*-196*e*, is longer than the bottom inductor wing 186*c*-186*d*, such that conductive layer 196*d* extends beyond a footprint of the bottom inductor wing 186*c*-186*d*. In another embodiment, shown in FIG. 4*j*, the top inductor wing 196*c*-196*e*, is substantially the same length as the bottom inductor wing 186*c*-186*d*, such that the entire footprint of the top inductor wing 196*c*-196*e* is disposed within the footprint of the bottom inductor wing 186*c*-186*d*. The lengths of the top inductor wing 196*c*-196*e* and the bottom inductor wing 186*c*-186*d* can vary according to the design and functionality of semiconductor die 144.

In FIGS. 4*h*-4*j*, conductive layer 196*c* is aligned with conductive layer 186*c*, and conductive layer 196*e* is aligned with conductive layer 186*d*. The top inductor wing 196*c*-196*e* is stacked over and aligned along the entire path or coil of the bottom inductor wing 186*c*-186*d*, and a footprint of the top inductor wing 196*c*-196*e* is within a footprint of the bottom inductor wing 186*c*-186*d* for the entire length of the coil of the bottom inductor wing 186*c*-186*d*. In another embodiment, the top inductor wing 196*c*-196*e* and the bottom inductor wing 186*c*-186*d* are aligned with a horizontal offset such that the footprint of the top inductor wing 196*c*-196*e* is outside the footprint of the bottom inductor wing 186*c*-186*d*. The process of forming IPDs externally to semiconductor die is prone to cause some degree of misalignment which can degrade the IPDs, particularly when the IPDs are formed over semiconductor die and also separately during subsequent formation of RDLs. The top inductor wing 196*c*-196*e* is stacked over and aligned along the entire path or coil of the bottom inductor wing 186*c*-186*d* within semiconductor die 210 for higher quality and reliable IPDs.

Figure 4K:
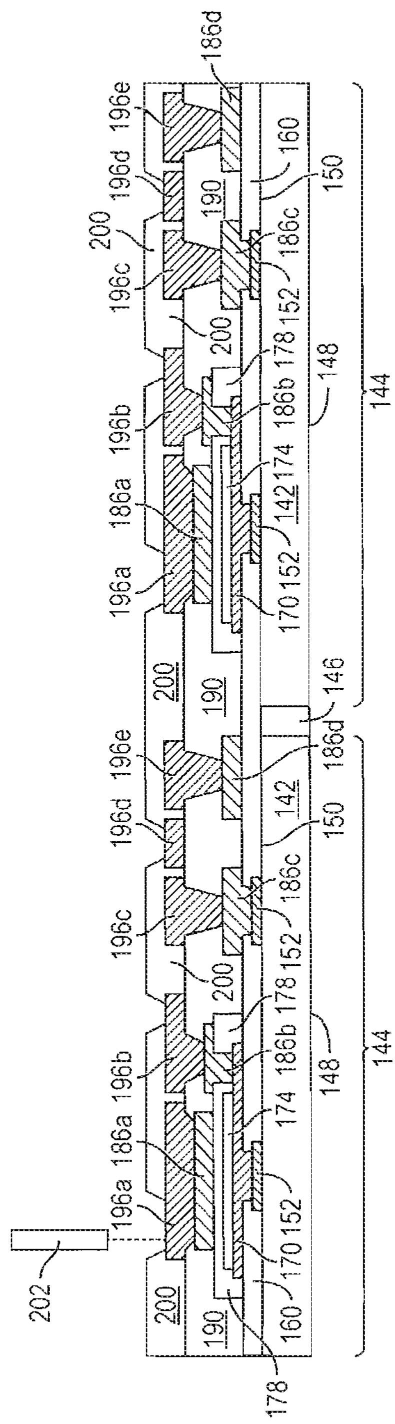
Figure 4L:
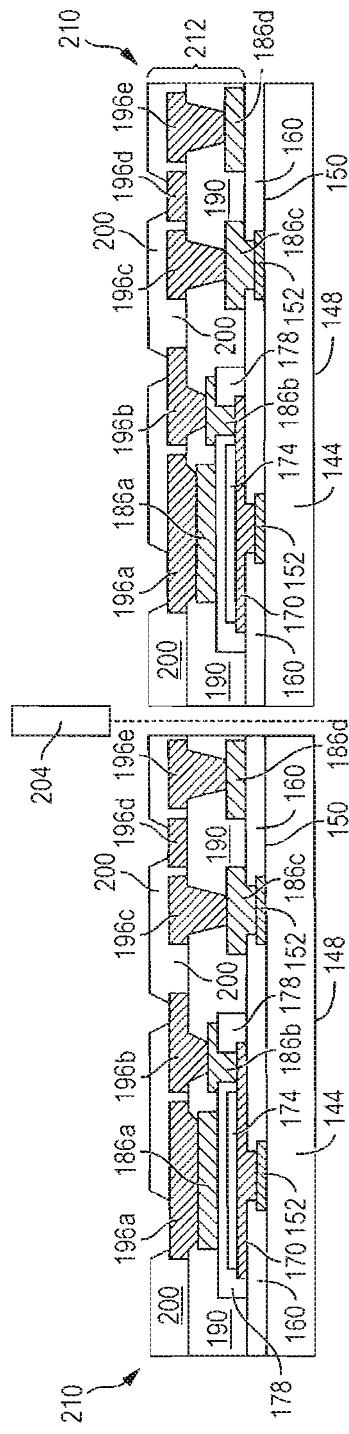

In FIG. 4*k*, an insulating or passivation layer 200 is formed over insulating layer 190 and conductive layer 196 using PVD, CVD, printing, spin coating, spray coating, screen printing or lamination. Insulating layer 200 contains one or more layers of SiO2, Si3N4, SiON, Ta2O5, Al2O3, organic polymer, or other material having similar insulating and structural properties.

In one embodiment, insulating layer 200 undergoes a curing process after deposition, with a curing temperature ranging from 165-380° C. In another embodiment, a thickness of insulating layer 200 ranges between 5-20 μm. A portion of insulating layer 200 is removed by an etching process with a patterned photoresist layer, to expose conductive layer 196. Alternatively, a portion of insulating layer 200 is removed by LDA using laser 202 to expose conductive layer 196.

In FIG. 41, the assembly from FIGS. 4*a*-4*k* is singulated through insulating layer 200, insulating layer 190, insulating layer 160, and saw street 146 with saw blade or laser cutting tool 204 to create individual IPD die 210. The structures described in FIGS. 4*c*-4*k*, including conductive layers 170, 186, and 196, resistive layer 174, and insulating layers 160, 178, 190, and 200 constitute a plurality of passive circuit elements or IPDs 212 formed within IPD die 210. The IPDs 212 provide the electrical characteristics needed for high frequency applications, such as resonators, high-pass filters, low-pass filters, band-pass filters, symmetric Hi-Q resonant transformers, and tuning capacitors. The IPDs 212 can be used as front-end wireless RF components, which can be positioned between the antenna and transceiver. The inductors can be hi-Q balun, transformer, or coil, operating up to 100 Gigahertz. In some applications, multiple baluns are formed on a same substrate, allowing multi-band operation. For example, two or more baluns are used in a quad-band for mobile phones or other global system for mobile (GSM) communications, each balun is dedicated for a frequency band of operation of the quad-band device. A typical RF system requires multiple IPDs and other high frequency circuits in one or more semiconductor packages to perform the necessary electrical functions.

Figure 5A:
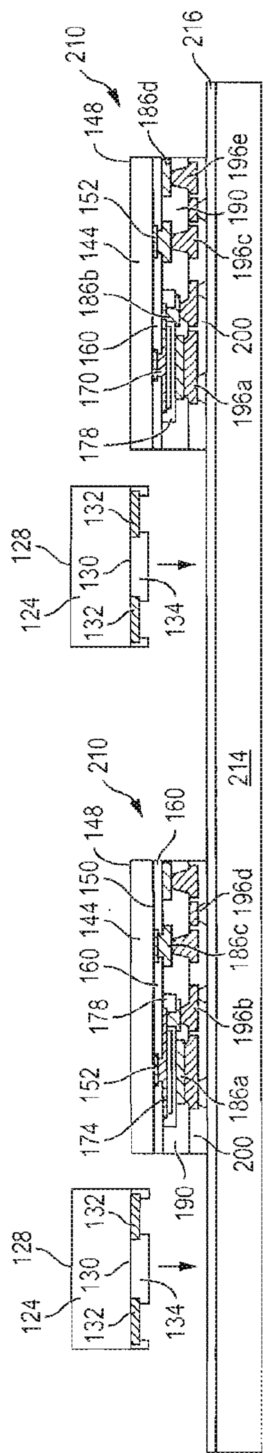
FIGS. 5*a*-5*i* illustrate a process of forming a conductive bridge and a fan out redistribution layer over semiconductor die and IPDs.

FIGS. 5*a*-5*i* illustrate, in relation to FIGS. 1, and 2*a*-2*c*, a process of forming a conductive bridge and a fan out RDL over semiconductor die and IPDs. In FIG. 5*a*, a substrate or carrier 214 contains sacrificial base material such as silicon, polymer, beryllium oxide, or other suitable low-cost, rigid material for structural support. An interface layer or double-sided tape 216 is formed over carrier 214 as a temporary adhesive bonding film or etch-stop layer. Leading with insulating layer 200, IPD die 210 from FIG. 41 are positioned over and mounted to interface layer 216 and carrier 214 using a pick and place operation. Leading with insulating layer 134, semiconductor die 124 from FIG. 3*c* are positioned over and mounted to interface layer 216 and carrier 214 using a pick and place operation. Insulating layer 200 is substantially coplanar with insulating layer 134.

Figure 5B:
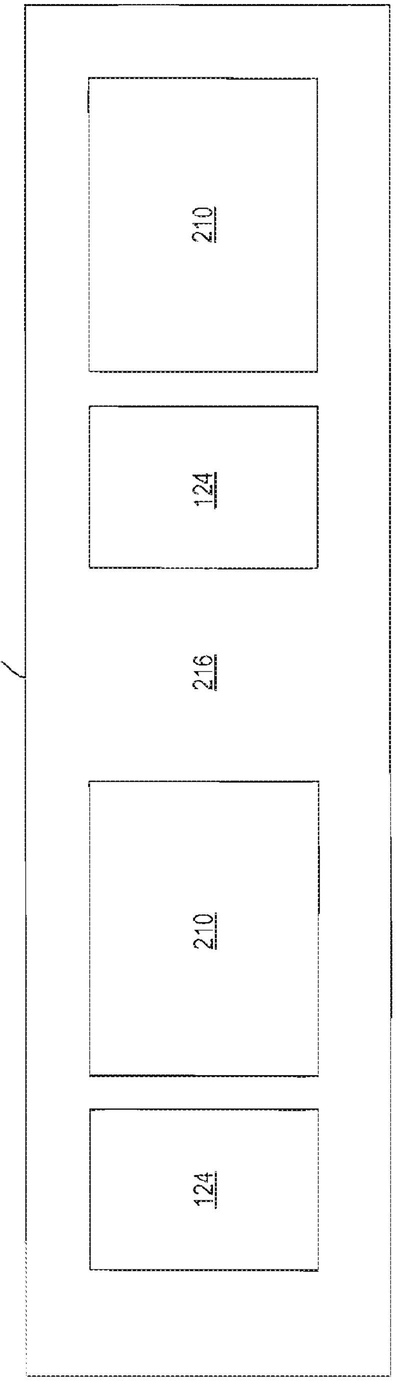

FIG. 5*b* shows a top or plan view of the assembly from FIG. 5*a*. IPD die 210 is mounted next to semiconductor die 124 over carrier 214 with interface layer 216. IPD die 210 is adjacent to semiconductor die 124 and IPD die 210 is separated from semiconductor die 124 by a space or gap between IPD die 210 and semiconductor die 124.

Figure 5C:
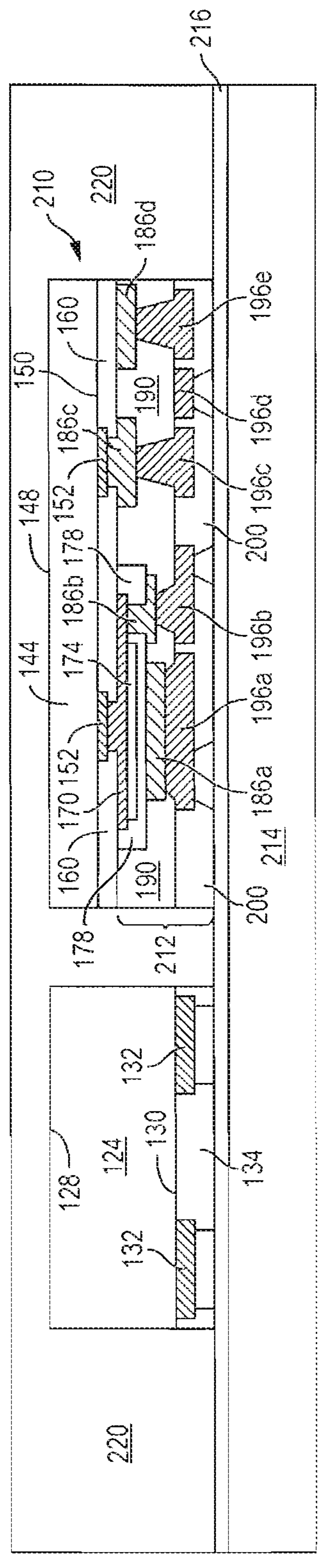

FIG. 5*c* shows the assembly from FIGS. 5*a*-5*b*, focusing on a single IPD die 210, and a single semiconductor die 124. An encapsulant or molding compound 220 is deposited over IPD die 210, semiconductor 124, and carrier 214 using a paste printing, compressive molding, transfer molding, liquid encapsulant molding, vacuum lamination, spin coating, or other suitable applicator. Encapsulant 220 can be polymer composite material, such as epoxy resin with filler, epoxy acrylate with filler, or polymer with proper filler. Encapsulant 220 is non-conductive and environmentally protects the semiconductor device from external elements and contaminants. Encapsulant 220 has high volume resistivity, (e.g., greater than E14 Ohm-cm), low dielectric constant (e.g., less than 4.0), and low loss tangent (e.g., less than 0.05).

Figure 5D:
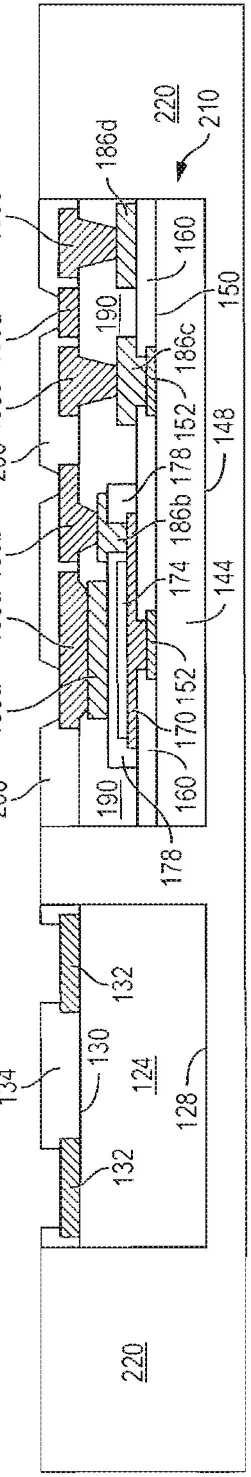

In FIG. 5*d*, carrier 214, and interface layer 216 are removed by chemical etching, mechanical peeling, CMP, mechanical grinding, thermal bake, UV light, laser scanning, or wet stripping to expose a surface of encapsulant 220, insulating layer 134, conductive layer 132, insulating layer 200, and conductive layer 196. Encapsulant 220 provides structural support for semiconductor die 124 and IPD die 210 after removal of carrier 214.

Figure 5E:
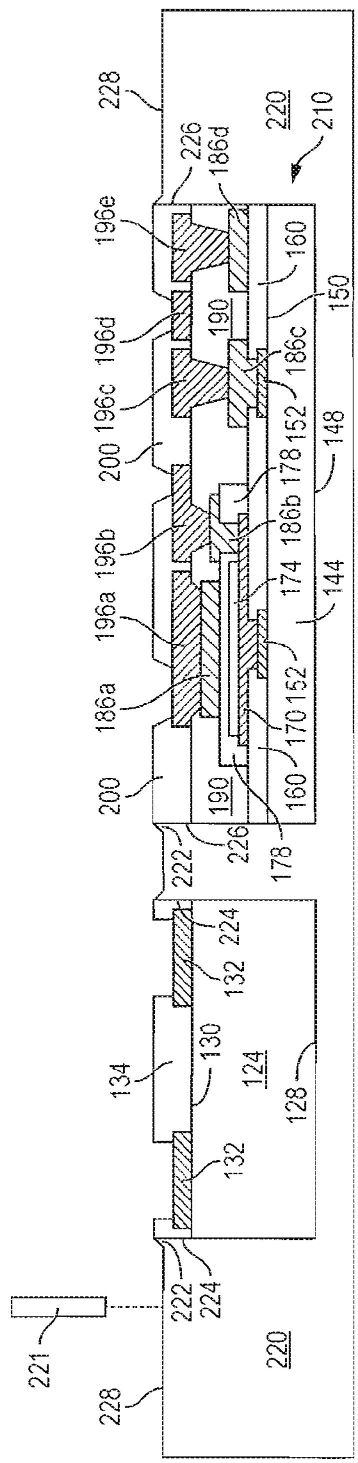

In FIG. 5*e*, encapsulant 220 is etched using a plasma process, wet chemical etching, or photoresist developing process to remove a portion of a surface of the encapsulant 220. Alternatively, a portion of encapsulant 220 is removed by LDA using laser 221. In one embodiment, a portion of the encapsulant 220, support structure 222, maintains coverage over a sidewall 224 of insulating layer 134. Support structure 222 also maintains coverage over a sidewall 226 of IPD die 210. Encapsulant 220 also has a surface 228 that is vertically offset from an exposed surface of insulating layer 134 and insulating layer 200.

Figure 5F:
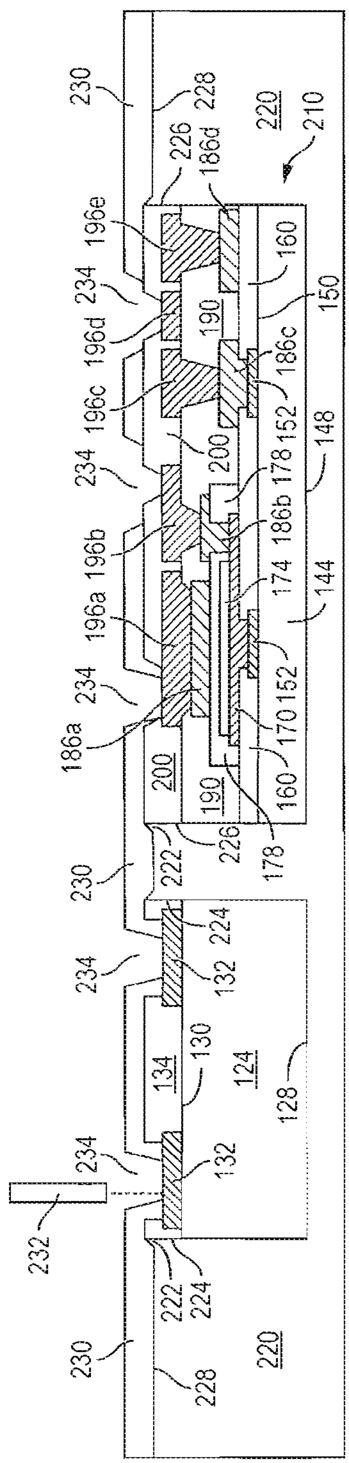

In FIG. 5*f*, an insulating or passivation layer 230 is formed over encapsulant 220, semiconductor die 124, and IPD die 210 using PVD, CVD, printing, spin coating, spray coating, screen printing or lamination. Insulating layer 230 contains one or more layers of SiO2, Si3N4, SiON, Ta2O5, Al2O3, organic polymer, or other material having similar insulating and structural properties. The thickness of insulating layer 230 can be adjusted according to the design and function of IPD die 210. In one embodiment, the thickness of insulating layer 230 ranges between 5-25 μm. A portion of insulating layer 230 is removed by an etching process with a patterned photoresist layer, to expose a portion of conductive layers 132 and 196. Alternatively, a portion of insulating layer 230 is removed by LDA using laser 232 to expose a portion of conductive layer 132 and conductive layer 196. The resulting vias 234 can have a straight, sloped, angled, curved, or stepped sidewall.

Figure 5G:
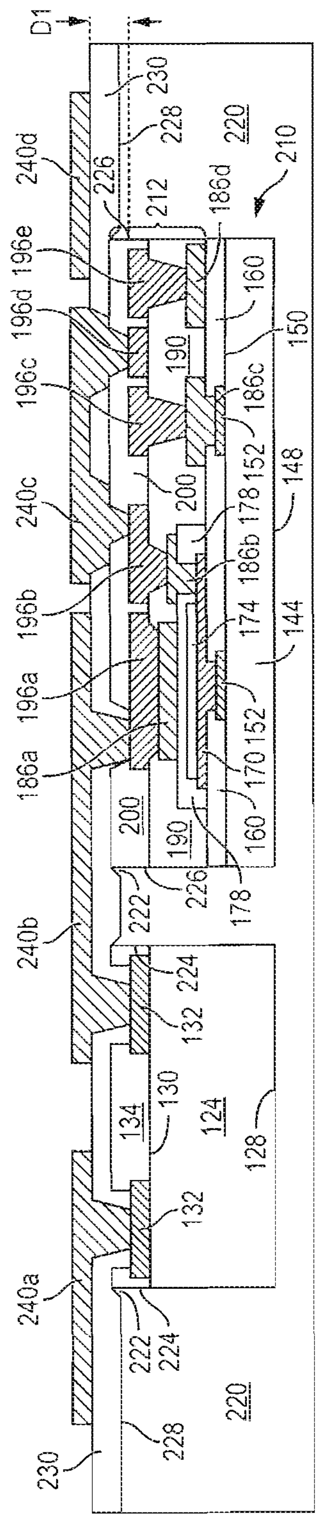

In FIG. 5*g*, an electrically conductive layer 240 is formed over insulating layer 230, insulating layer 200, conductive layer 132, and conductive layer 196 using patterning with PVD, CVD, sputtering, electrolytic plating, electroless plating process, or other suitable metal deposition process to form individual portions or sections 240*a*-240*d*. Conductive layer 240 can be one or more layers of Al, Cu, Sn, Ni, Au, Ag, or other suitable electrically conductive material. In one embodiment, conductive layer 240 is deposited using a suitable selective copper plating process, such as ion milling or back sputtering, with a suitable seed alloy such as TiCu, TiWCu, or TaNC. In another embodiment, a thickness of conductive layer 240 ranges between 3-12 μm. A portion of conductive layer 240 extends horizontally along insulating layer 230 and parallel to active surface 130 of semiconductor die 124 to laterally redistribute the electrical interconnect to conductive layers 132 and 196. Conductive layer 240 operates as a fan-out RDL, providing lateral redistribution for the electrical signals of semiconductor die 124 and IPD die 210. The individual portions of conductive layer 240*a*-240*d* can be electrically common or electrically isolated depending on the connectivity of the individual semiconductor die 124 and IPD die 210. A portion of conductive layer 240*a* extends through insulating layer 230 to electrically connect conductive layer 240*a* to conductive layer 132 of semiconductor die 124. A portion of conductive layer 240*b* extends through insulating layer 230 to electrically connect conductive layer 240*b* to conductive layer 132 of semiconductor die 124 and conductive layer 196*a* of IPD die 210.

A portion of conductive layer 240*c* extends through insulating layers 230 and 200 to electrically connect conductive layer 240*c* to conductive layers 196*b* and 196*d*. A portion of conductive layer 240*c* also extends horizontally along insulating layer 230, and operates as a stacked-inductor bridge or conductive bridge providing electrical interconnection between conductive layers 196*b* and 196*d*. Thus, conductive layer 240*c* is electrically connected to the top inductor wing 196*c*-196*e* and semiconductor die 144. The distance or gap D1 between the horizontal portions of conductive layers 240*a*-240*d* and conductive layers 196*a*-196*e* can be controlled or adjusted by increasing or decreasing the thickness of insulating layer 230 according to the design and function of IPD die 210. Semiconductor packages, particularly in high-current applications, are prone to leakage current between conductive layers or devices. Increasing the distance D1 by increasing the thickness of insulating layer 230 provides the ability to reduce leakage current between conductive layers 240*a*-240*d* and the IPDs 212, semiconductor die 144, and semiconductor die 124.

Figure 5H:
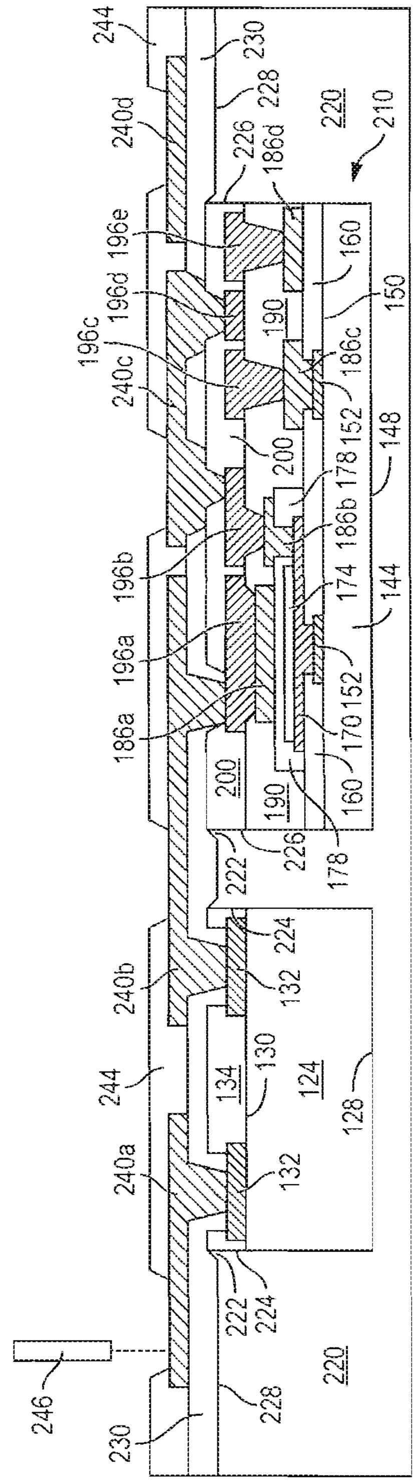

In FIG. 5*h*, an insulating or passivation layer 244 is formed over insulating layer 230 and conductive layer 240 using PVD, CVD, printing, spin coating, spray coating, screen printing or lamination. Insulating layer 244 contains one or more layers of SiO2, Si3N4, SiON, Ta2O5, Al2O3, organic polymer, or other material having similar insulating and structural properties. A portion of insulating layer 244 is removed by an etching process with a patterned photoresist layer to expose conductive layer 240. Alternatively, a portion of insulating layer 244 is removed by LDA using laser 246 to expose conductive layer 240.

Figure 5I:
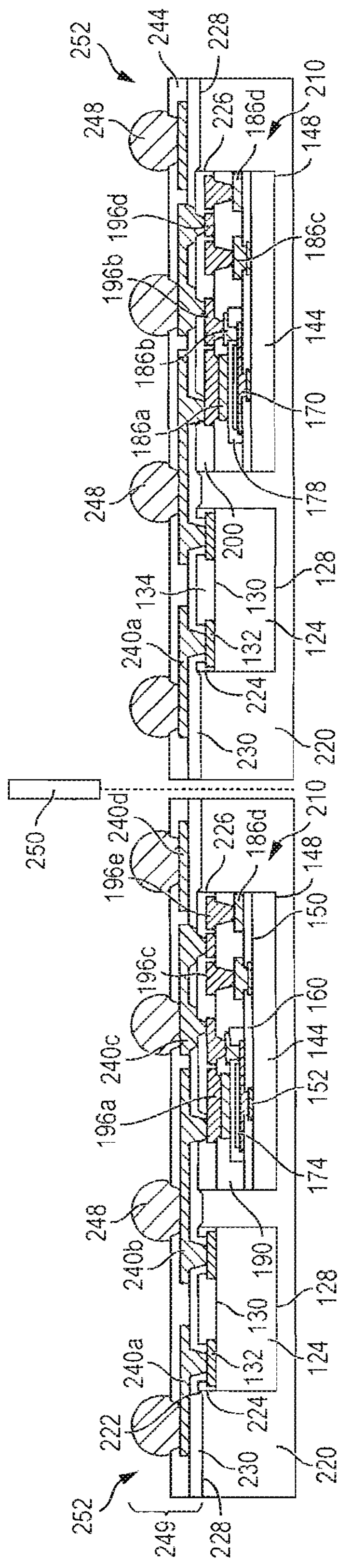

FIG. 5*i* shows the assembly from FIGS. 5*a*-5*h* with multiple IPD die 210 and semiconductor die 124. An electrically conductive bump material is deposited over the exposed conductive layer 240 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 240 using a suitable attachment or bonding process. In one embodiment, the bump material is reflowed by heating the material above its melting point to form balls or bumps 248. In some applications, bumps 248 are reflowed a second time to improve electrical contact to conductive layer 240. An under bump metallization (UBM) layer can be formed under bumps 248. Bumps 248 can also be compression bonded to conductive layer 240. Bumps 248 represent one type of interconnect structure that can be formed over conductive layer 240. The interconnect structure can also use stud bump, micro bump, or other electrical interconnect.

Collectively, insulating layers 230, and 244, conductive layer 240, and bumps 248 constitute a build-up interconnect structure 249. Additional conductive and insulating layers may be formed over insulating layer 244 prior to forming bumps 248, to provide additional vertical and horizontal electrical connectivity across the package according to the design and functionality of the semiconductor device. The assembly from FIGS. 5*a*-5*i* is singulated through insulating layer 244, insulating layer 230, and encapsulant 220 with saw blade or laser cutting tool 250 to create individual semiconductor packages or Fo-WLCSP 252.

Figure 6:
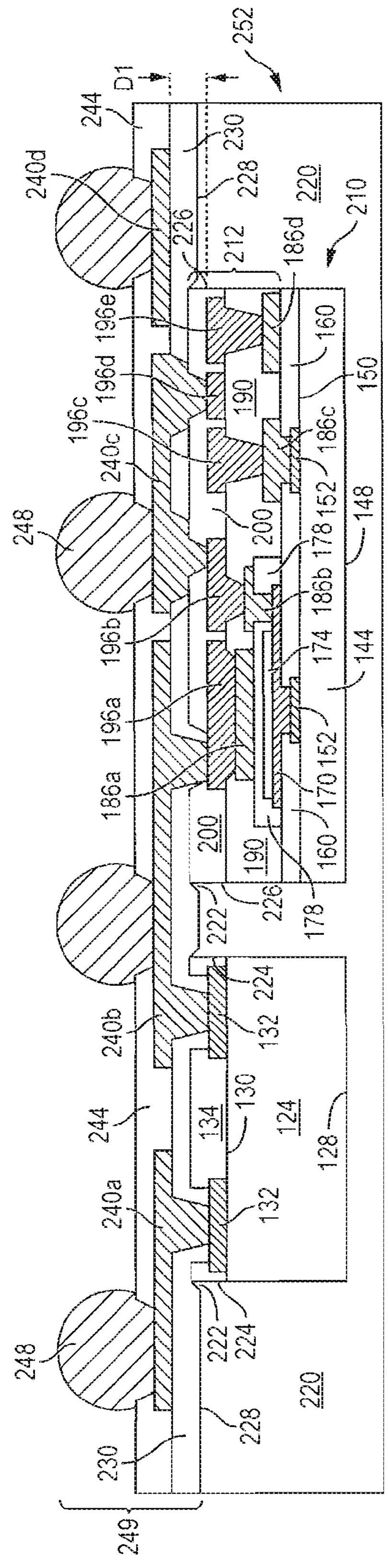
FIG. 6 illustrates a semiconductor package with a conductive bridge and a fan out redistribution layer formed over semiconductor die and top and bottom inductor wings.

FIG. 6 shows Fo-WLCSP 252 after singulation. Conductive layer 152 of semiconductor die 144 is electrically connected to conductive layer 170. Conductive layer 170, resistive layer 174, insulating layer 178, and conductive layer 186*a* form a MIM capacitor. Conductive layer 186*b* is electrically connected to conductive layer 170. Conductive layers 186*c*-186*d* constitute a bottom inductor wing formed over and within a footprint of semiconductor die 144.

Conductive layer 196*a* is electrically connected to and aligned with conductive layer 186*a*. Conductive layer 196*b* is electrically connected to and aligned with conductive layer 186*b*. Conductive layer 196*c* is electrically connected to and aligned with conductive layer 186*c*. Conductive layer 196*e* is electrically connected to and aligned with conductive layer 186*d*. Conductive layers 196*c*-196*e* constitute a top inductor wing. The process of forming IPDs externally to semiconductor die is prone to cause some degree of misalignment which can degrade the IPDs, particularly when the IPDs are formed over semiconductor die and also separately during subsequent formation of RDLs. The top inductor wing 196*c*-196*e* is stacked over and aligned along the entire path or coil of the bottom inductor wing 186*c*-186*d* within semiconductor die 210 for higher quality and reliable IPDs.

Conductive layers 170, 186, and 196, resistive layer 174, and insulating layers 160, 178, 190, and 200 constitute a plurality of passive circuit elements or IPDs 212 formed over semiconductor die 144. Semiconductor die 144 are singulated to create individual IPD die 210. IPD die 210 and semiconductor die 124 are mounted over a temporary carrier 214. An encapsulant 220 is formed over semiconductor die 124, semiconductor die 144, and carrier 214. Encapsulant 220 provides structural support and stiffness during RDL and bump formation. An insulating layer 230 is formed over encapsulant 220, semiconductor die 124, and IPD die 210. The thickness of insulating layer 230 can be adjusted according to the design and functionality of IPD die 210.

An electrically conductive layer 240 is formed over insulating layer 230, IPD die 210 and semiconductor die 124. Conductive layer 240 operates as a fan-out RDL, providing lateral redistribution for the electrical signals of semiconductor die 124 and IPD die 210. The individual portions of conductive layer 240*a*-240*d* can be electrically common or electrically isolated depending on the connectivity of the individual semiconductor die 124 and IPD die 210. Conductive layer 240*a* is electrically connected to conductive layer 132 of semiconductor die 124. Conductive layer 240*b* is electrically connected to conductive layer 132 of semiconductor die 124 and conductive layer 196*a* of IPD die 210. Conductive layer 240*c* is electrically connected to conductive layers 196*b* and 196*d*. A portion of conductive layer 240*c* extends horizontally along insulating layer 230, and operates as a stacked-inductor bridge or conductive bridge providing electrical interconnection between conductive layers 196*b* and 196*d*. Thus, conductive layer 240*c* is electrically connected to the top inductor wing 196*c*-196*e* and semiconductor die 144. The distance or gap D1 between the horizontal portions of conductive layers 240*a*-240*d* and conductive layers 196*a*-196*e* can be controlled or adjusted by increasing or decreasing the thickness of insulating layer 230 according to the design and function of IPD die 210. Semiconductor packages, particularly in high-current applications, are prone to leakage current between conductive layers or devices. Increasing the distance D1 by increasing the thickness of insulating layer 230 provides the ability to reduce leakage current between conductive layers 240*a*-240*d* and the IPDs 212, semiconductor die 144, and semiconductor die 124.

Figure 7:
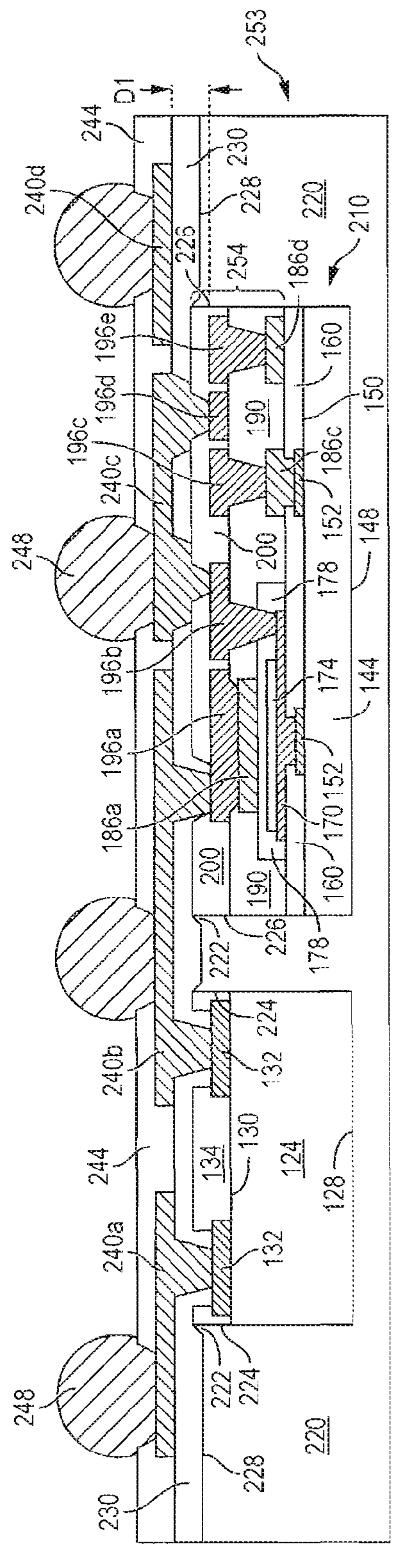
FIG. 7 illustrates a semiconductor package with a conductive bridge and a redistribution layer formed over IPDs with a top inductor wing directly connected to a capacitor.

FIG. 7 shows Fo-WLCSP 253, an alternate embodiment, similar to the assembly shown in FIG. 6, absent the formation of conductive layer 186*b*. Conductive layer 196*b* is mechanically and electrically connected directly to conductive layer 170. Directly connecting conductive layer 196*b* to conductive layer 170, without an intervening conductive layer 186*b*, allows for a higher degree of uniformity for insulating layer 178 by avoiding the need for an ion milling or back sputtering process prior to depositing conductive layer 186*b*. Directly connecting conductive layer 196*b* to conductive layer 170, without an intervening conductive layer 186*b*, also reduces plasma damage on insulating layer 178, which acts as a capacitor dielectric material.

Figure 8A:
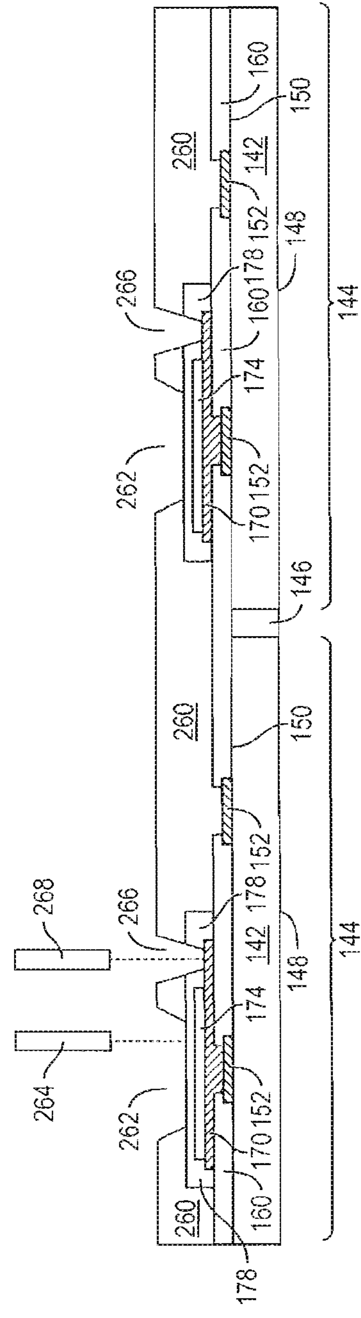
FIGS. 8*a*-8*c* illustrate a process of forming IPDs over a semiconductor die with a single inductor.
Figure 8B:
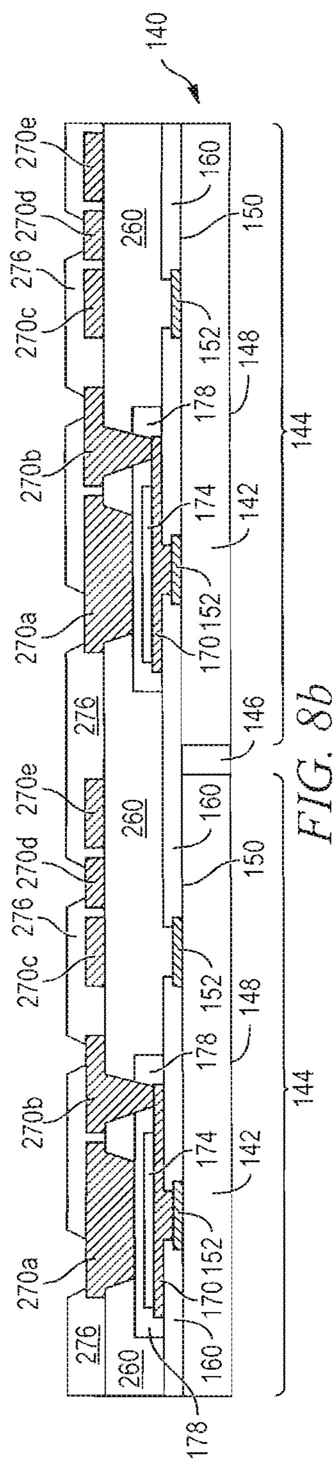
Figure 8C:
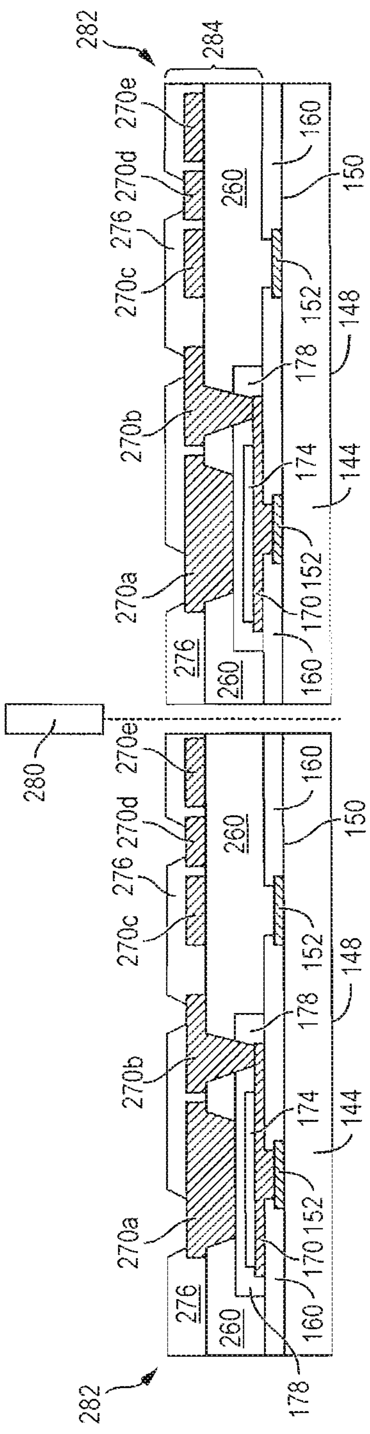

FIGS. 8*a*-8*c* illustrate, in relation to FIGS. 1, and 2*a*-2*c*, a process of forming IPDs over a semiconductor die with a single inductor. In FIG. 8*a*, continuing from FIG. 4*e*, an insulating layer 260 is formed over insulating layer 178, insulating layer 160, and conductive layer 152 using PVD, CVD, printing, spin coating, spray coating, screen printing or lamination. Insulating layer 260 contains one or more layers of SiO2, Si3N4, SiON, Ta2O5, Al2O3, organic polymer, or other material having similar insulating and structural properties.

In one embodiment, insulating layer 260 undergoes a curing process after being deposited, with a curing temperature ranging from 165-380° C. In another embodiment, a thickness of insulating layer 260 ranges between 5-20 μm. A portion of insulating layer 260 is removed by an etching process with a patterned photoresist layer to create opening 262 and to expose a portion of insulating layer 178 over resistive layer 174. Alternatively, a portion of insulating layer 260 is removed by LDA using laser 264 to create opening 262 and to expose a portion of insulating layer 178 over resistive layer 174. A portion of insulating layer 260 and insulating layer 178 are removed by an etching process with a patterned photoresist layer to create opening 266 and to expose a portion of conductive layer 170 outside a footprint of resistive layer 174. Alternatively, a portion of insulating layer 260 is removed by LDA using laser 268 to create opening 266 and to expose a portion of conductive layer 170 outside a footprint of resistive layer 174. Openings 262 and 266 can have straight, tapered, or stepped sidewalls.

In FIG. 8*b*, an electrically conductive layer 270 is formed over insulating layers 260, and 178, and conductive layer 170 using patterning with PVD, CVD, sputtering, electrolytic plating, electroless plating process, or other suitable metal deposition process to form individual portions or sections 196*a*-196*e*. Conductive layer 270 includes one or more layers of Al, Cu, Sn, Ni, Au, Ag, or other suitable electrically conductive material. In one embodiment, conductive layer 270 is deposited using a suitable selective copper plating process, such as ion milling or back sputtering, with a suitable seed alloy such as TiCu, TiWCu, or TaNC. In another embodiment, conductive layer 270 has a thickness between 3 and 15 μm.

The individual portions of conductive layer 270*a*-270*e* can be electrically common or electrically isolated according to the design and function of the individual semiconductor die 144. A portion of conductive layer 270*a* extends vertically through opening 262, and in one embodiment, conductive layer 170, resistive layer 174, insulating layer 178, and conductive layer 270*a* form a MIM capacitor. A portion of conductive layer 270*b* extends vertically through opening 266 to electrically connect conductive layer 270*b* to conductive layer 170. Directly connecting conductive layer 270*b* to conductive layer 170, without an intervening conductive layer, for example conductive layer 186*b* in FIG. 6, allows for a higher degree of uniformity for insulating layer 178 by avoiding the need for an ion milling or back sputtering process prior to depositing an intervening conductive layer, and reduces plasma damage on insulating layer 178, which acts as a capacitor dielectric material. Additionally, manufacturing cost and time is reduced by avoiding formation of an intervening conductive layer such as conductive layer 186, shown in FIG. 6. The individual sections of conductive layer 270*c*-270*e* can be wound or coiled in plan-view to produce or exhibit the desired characteristics of an inductor. Conductive layers 270*c*-270*e* form an inductor wing formed over and within a footprint of semiconductor die 144.

An insulating or passivation layer 276 is formed over insulating layer 260 and conductive layer 270 using PVD, CVD, printing, spin coating, spray coating, screen printing or lamination. Insulating layer 276 contains one or more layers of SiO2, Si3N4, SiON, Ta2O5, Al2O3, organic polymer, or other material having similar insulating and structural properties.

In one embodiment, insulating layer 276 undergoes a curing process after deposition, with a curing temperature ranging from 165-380° C. In another embodiment, a thickness of insulating layer 276 ranges between 5-20 μm. A portion of insulating layer 276 is removed by an etching process with a patterned photoresist layer, to expose conductive layer 270. Alternatively, a portion of insulating layer 276 is removed by LDA using laser 278 to expose conductive layer 270.

In FIG. 8*c*, the assembly from FIGS. 4*a*-4*e* and 8*a*-8*b* is singulated through insulating layer 276, insulating layer 260, insulating layer 160, and saw street 146 with saw blade or laser cutting tool 280 to create individual IPD die 282. The structures described in FIGS. 4*c*-4*e*, and 8*a*-8*c*, including conductive layers 170, and 270, resistive layer 174, and insulating layers 160, 178, 260, and 276 constitute a plurality of passive circuit elements or IPDs 284 formed within IPD die 282. The IPDs 284 provide the electrical characteristics needed for high frequency applications, such as resonators, high-pass filters, low-pass filters, band-pass filters, symmetric Hi-Q resonant transformers, and tuning capacitors. The IPDs 284 can be used as front-end wireless RF components, which can be positioned between the antenna and transceiver. The inductors can be hi-Q balun, transformer, or coil, operating up to 100 Gigahertz. In some applications, multiple baluns are formed on a same substrate, allowing multi-band operation. For example, two or more baluns are used in a quad-band for mobile phones or other GSM communications, each balun is dedicated for a frequency band of operation of the quad-band device. A typical RF system requires multiple IPDs and other high frequency circuits in one or more semiconductor packages to perform the necessary electrical functions.

Figure 9A:
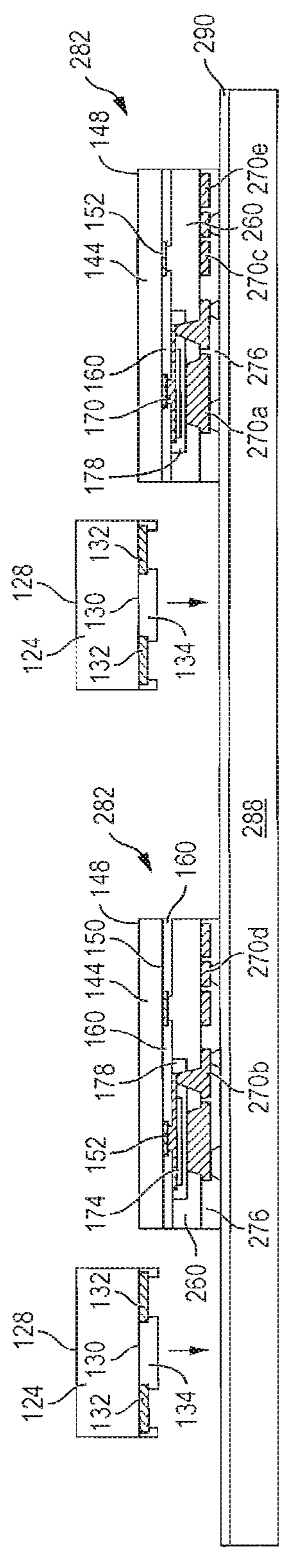
FIGS. 9*a*-9*i* illustrate a process of forming a conductive bridge and a fan out RDL over semiconductor die with a single inductor.

FIGS. 9*a*-9*i* illustrate, in relation to FIGS. 1, and 2*a*-2*c*, a process of forming a conductive bridge and a fan out RDL over semiconductor die and IPDs with a single inductor. In FIG. 9*a*, a substrate or carrier 288 contains sacrificial base material such as silicon, polymer, beryllium oxide, or other suitable low-cost, rigid material for structural support. An interface layer or double-sided tape 290 is formed over carrier 288 as a temporary adhesive bonding film or etch-stop layer. Leading with insulating layer 276, IPD die 282 from FIG. 8*c* are positioned over and mounted to carrier 288 with interface layer 290 using a pick and place operation. Leading with insulating layer 134, semiconductor die 124 from FIG. 3*c* are positioned over and mounted to carrier 288 with interface layer 290 using a pick and place operation. Insulating layer 276 is substantially coplanar with insulating layer 134.

Figure 9B:
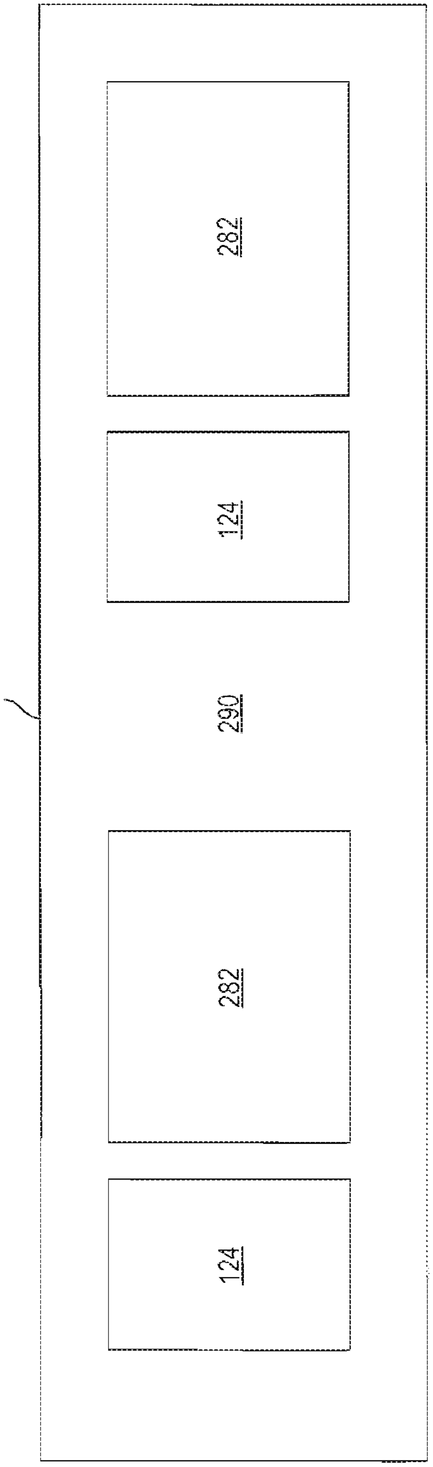

FIG. 9*b* shows a top or plan view of the assembly from FIG. 9*a*. IPD die 282 is mounted next to semiconductor die 124 over carrier 288 with interface layer 290. IPD die 282 is adjacent to semiconductor die 124 and IPD die 282 is separated from semiconductor die 124 by a space or gap between IPD die 282 and semiconductor die 124.

Figure 9C:
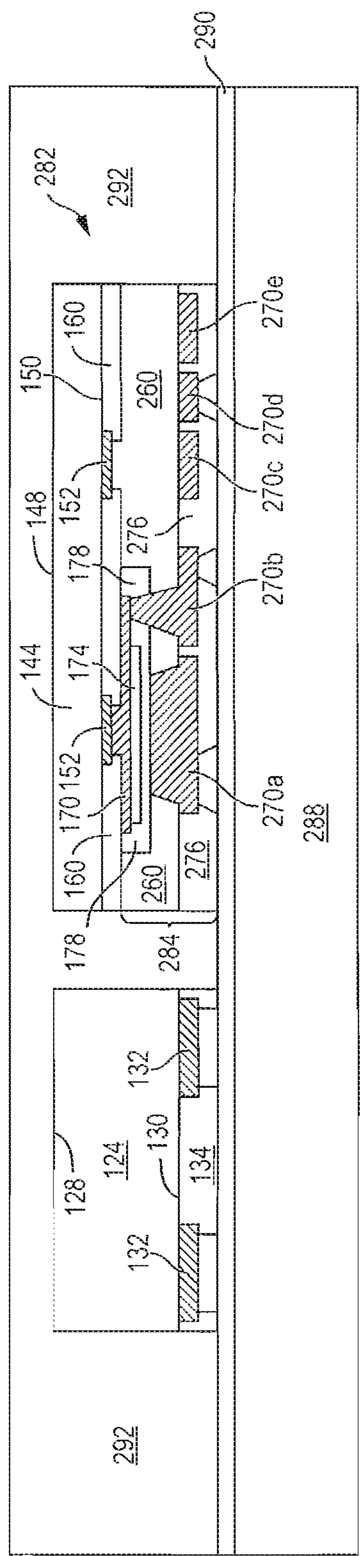

FIG. 9*c* shows the assembly from FIGS. 9*a*-9*b*, focusing on a single IPD die 282, and a single semiconductor die 124. An encapsulant or molding compound 292 is deposited over IPD die 282, semiconductor 124, and carrier 288 using a paste printing, compressive molding, transfer molding, liquid encapsulant molding, vacuum lamination, spin coating, or other suitable applicator. Encapsulant 292 can be polymer composite material, such as epoxy resin with filler, epoxy acrylate with filler, or polymer with proper filler. Encapsulant 292 is non-conductive and environmentally protects the semiconductor device from external elements and contaminants. Encapsulant 292 has high volume resistivity, (e.g., greater than E14 Ohm-cm), low dielectric constant (e.g., less than 4.0), and low loss tangent (e.g., less than 0.05).

Figure 9D:
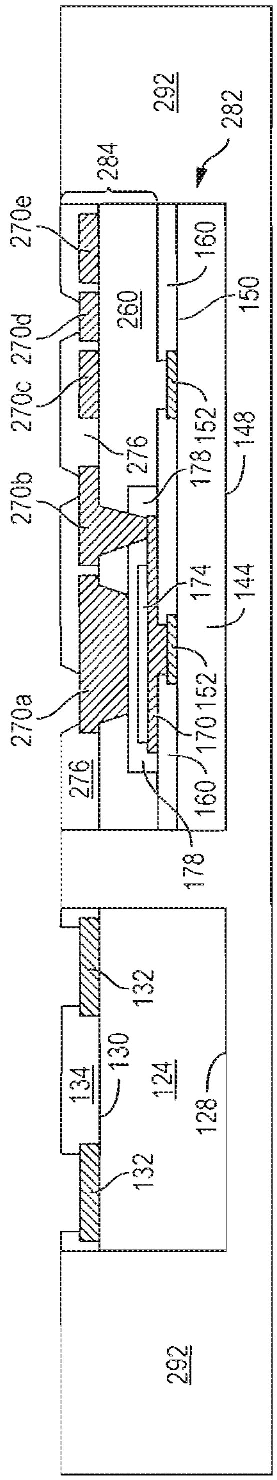

In FIG. 9*d*, carrier 288, and interface layer 290 are removed by chemical etching, mechanical peeling, CMP, mechanical grinding, thermal bake, UV light, laser scanning, or wet stripping to expose a surface of encapsulant 292, insulating layer 134, conductive layer 132, insulating layer 276, and conductive layer 270. Encapsulant 292 provides structural support for semiconductor die 124 and IPD die 282 after removal of carrier 288.

Figure 9E:
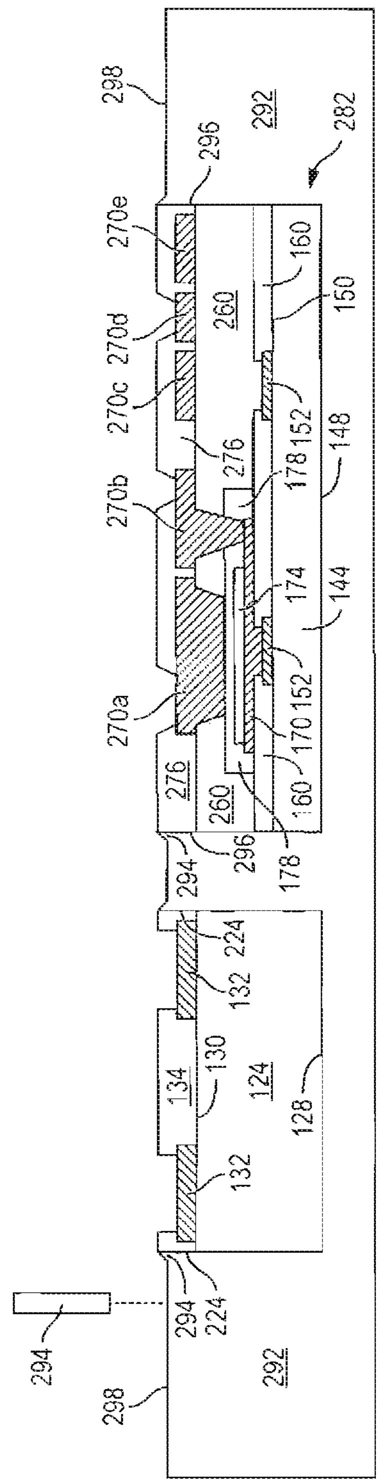

In FIG. 9*e*, encapsulant 292 is etched using a plasma process, wet chemical etching, or photoresist developing process to remove a portion of a surface of the encapsulant 292. Alternatively, a portion of encapsulant 292 is removed by LDA using laser 294. In one embodiment, a portion of the encapsulant 292, support structure 294, maintains coverage over a sidewall 224 of insulating layer 134. Support structure 294 also maintains coverage over a sidewall 296 of IPD die 282. Encapsulant 292 also has a surface 298 that is vertically offset from an exposed surface of insulating layer 134 and insulating layer 276.

Figure 9F:
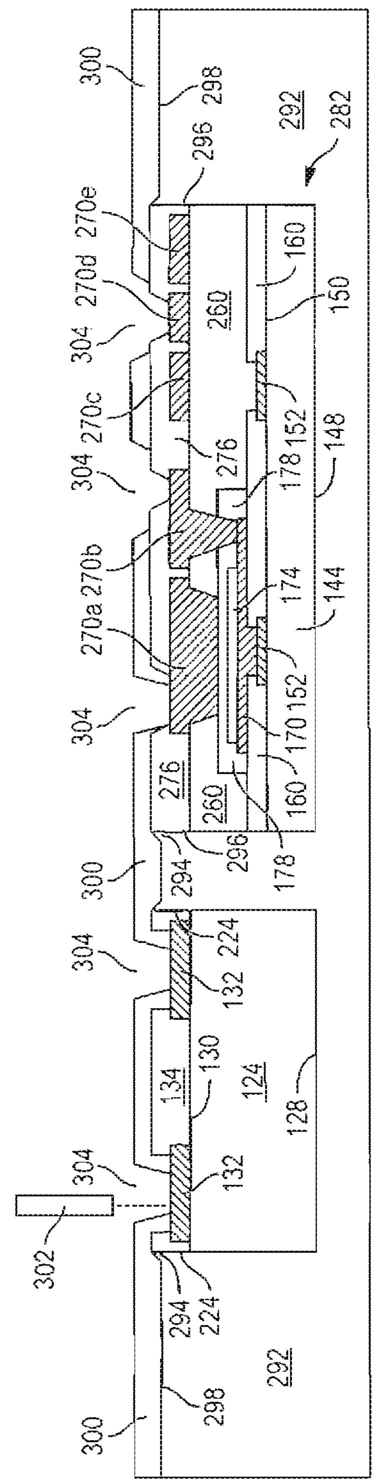

In FIG. 9*f*, an insulating or passivation layer 300 is formed over encapsulant 292, semiconductor die 124, and IPD die 282 using PVD, CVD, printing, spin coating, spray coating, screen printing or lamination. Insulating layer 300 contains one or more layers of SiO2, Si3N4, SiON, Ta2O5, Al2O3, organic polymer, or other material having similar insulating and structural properties. The thickness of insulating layer 300 can be adjusted according to the design and function of IPD die 282. In one embodiment, the thickness of insulating layer 300 ranges between 5-25 μm. A portion of insulating layer 300 is removed by an etching process with a patterned photoresist layer, to expose a portion of conductive layers 132 and 270. Alternatively, a portion of insulating layer 300 is removed by LDA using laser 302 to expose a portion of conductive layer 132 and conductive layer 270. The resulting vias 304 can have a straight, sloped, angled, curved, or stepped sidewall.

Figure 9G:
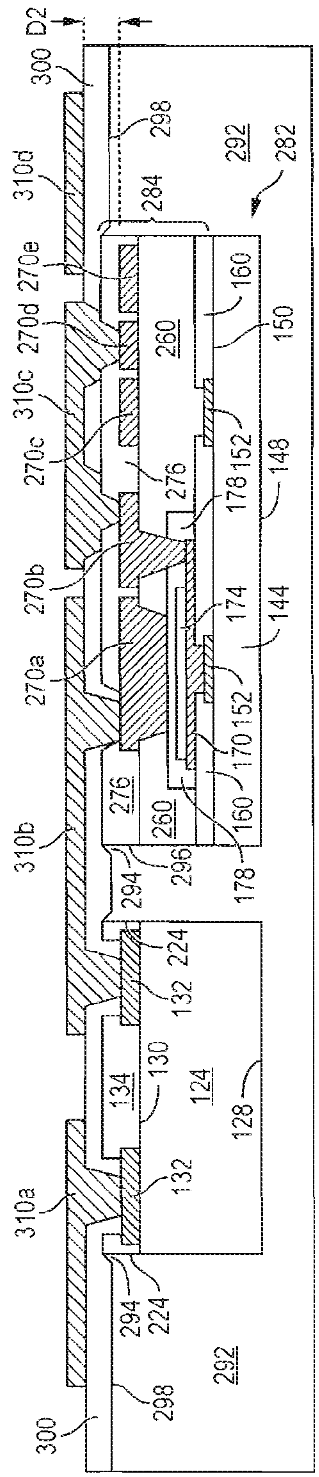

In FIG. 9*g*, an electrically conductive layer 310 is formed over insulating layer 300, insulating layer 276, conductive layer 132, and conductive layer 270 using patterning with PVD, CVD, sputtering, electrolytic plating, electroless plating process, or other suitable metal deposition process to form individual portions or sections 310*a*-310*d*. Conductive layer 310 can be one or more layers of Al, Cu, Sn, Ni, Au, Ag, or other suitable electrically conductive material. In one embodiment, a thickness of conductive layer 310 ranges between 3-12 μm. A portion of conductive layer 310 extends horizontally along insulating layer 300 and parallel to active surface 130 of semiconductor die 124 to laterally redistribute the electrical interconnect to conductive layers 132 and 270. Conductive layer 310 operates as a fan-out RDL, providing lateral redistribution for the electrical signals of semiconductor die 124 and IPD die 282. The individual portions of conductive layer 310*a*-310*d* can be electrically common or electrically isolated depending on the connectivity of the individual semiconductor die 124 and IPD die 282. A portion of conductive layer 310*a* extends through insulating layer 300 to electrically connect conductive layer 310*a* to conductive layer 132 of semiconductor die 124. A portion of conductive layer 310*b* extends through insulating layer 300 to electrically connect conductive layer 310*b* to conductive layer 132 of semiconductor die 124 and conductive layer 270*a* of IPD die 282.

A portion of conductive layer 310*c* extends through insulating layers 300 and 276 to electrically connect conductive layer 310*c* to conductive layers 270*b* and 270*d*. A portion of conductive layer 310*c* also extends horizontally along insulating layer 300, and operates as a stacked-inductor bridge or conductive bridge providing electrical interconnection between conductive layers 270*b* and 270*d*. Thus, conductive layer 310*c* is electrically connected to the inductor wing 270*c*-270*e* and semiconductor die 144. The distance or gap D2 between the horizontal portions of conductive layers 310*a*-310*d* and conductive layers 270*a*-270*e* can be controlled or adjusted by increasing or decreasing the thickness of insulating layer 300 according to the design and function of IPD die 282. Semiconductor packages, particularly in high-current applications, are prone to leakage current between conductive layers or devices. Increasing the distance D2 by increasing the thickness of insulating layer 300 provides the ability to reduce leakage current between conductive layers 310*a*-310*d* and the IPDs 284, semiconductor die 144, and semiconductor die 124.

Figure 9H:
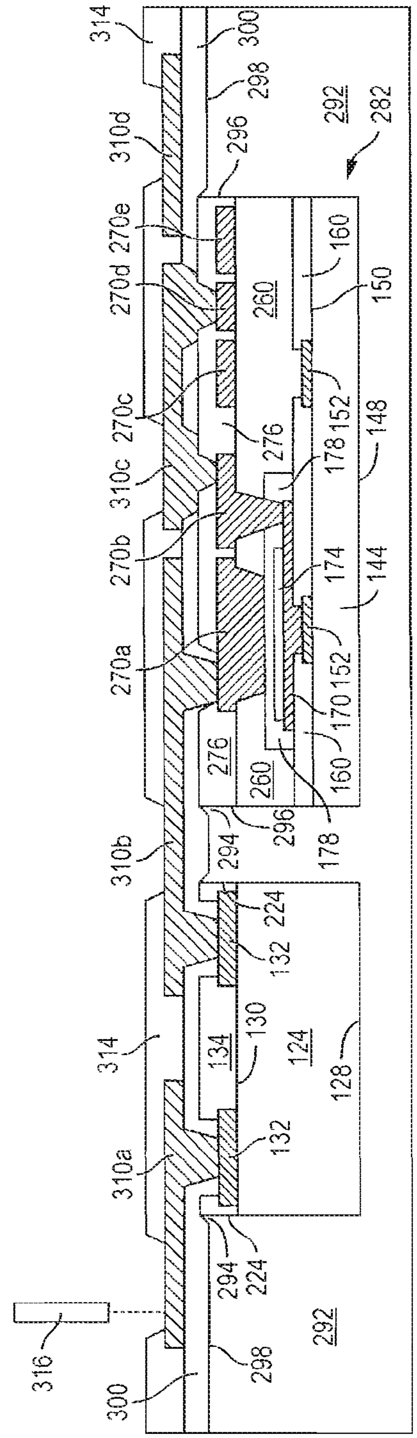

In FIG. 9*h*, an insulating or passivation layer 314 is formed over insulating layer 300 and conductive layer 310 using PVD, CVD, printing, spin coating, spray coating, screen printing or lamination. Insulating layer 314 contains one or more layers of SiO2, Si3N4, SiON, Ta2O5, Al2O3, organic polymer, or other material having similar insulating and structural properties. A portion of insulating layer 314 is removed by an etching process with a patterned photoresist layer to expose conductive layer 310. Alternatively, a portion of insulating layer 314 is removed by LDA using laser 316 to expose conductive layer 310.

Figure 9I:
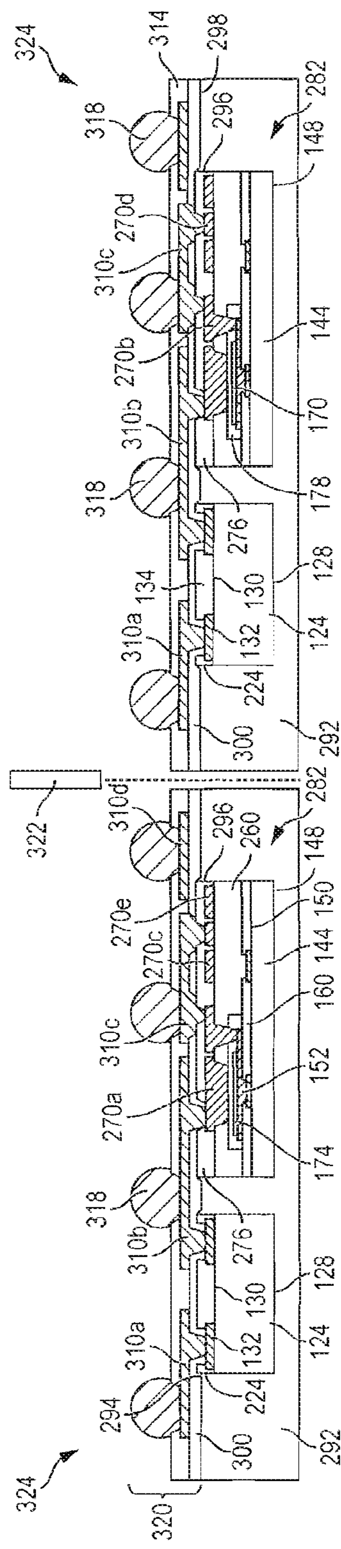

FIG. 9*i* shows the assembly from FIGS. 9*a*-9*h* with multiple IPD die 282 and semiconductor die 124. An electrically conductive bump material is deposited over the exposed conductive layer 310 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 310 using a suitable attachment or bonding process. In one embodiment, the bump material is reflowed by heating the material above its melting point to form balls or bumps 318. In some applications, bumps 318 are reflowed a second time to improve electrical contact to conductive layer 310. A UBM layer can be formed under bumps 318. Bumps 318 can also be compression bonded to conductive layer 310. Bumps 318 represent one type of interconnect structure that can be formed over conductive layer 310. The interconnect structure can also use stud bump, micro bump, or other electrical interconnect.

Collectively, insulating layers 300, and 314, conductive layer 310, and bumps 318 constitute a build-up interconnect structure 320. Additional conductive and insulating layers may be formed over insulating layer 314 prior to forming bumps 318, to provide additional vertical and horizontal electrical connectivity across the package according to the design and functionality of the semiconductor device. The assembly from FIGS. 9*a*-9*i* is singulated through insulating layer 314, insulating layer 300, and encapsulant 292 with saw blade or laser cutting tool 322 to create individual semiconductor packages or Fo-WLCSP 324.

Figure 10:
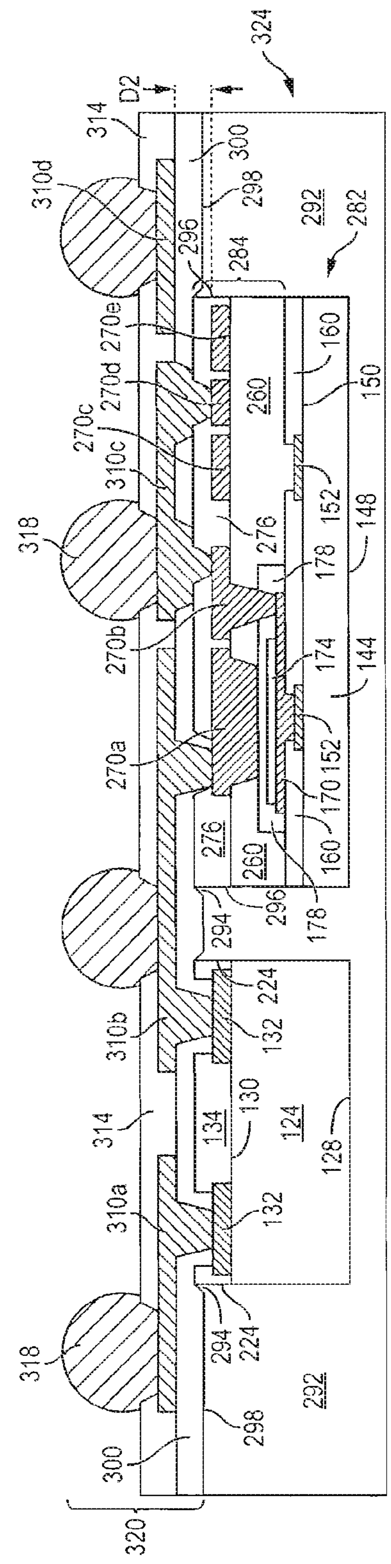
FIG. 10 illustrates a semiconductor package with a conductive bridge and a fan out RDL over semiconductor die and a single inductor.

FIG. 10 shows Fo-WLCSP 324 after singulation. Fo-WLCSP 324 is similar to the assembly shown in FIG. 6, absent the formation of conductive layer 186. Conductive layer 170, resistive layer 174, insulating layer 178, and conductive layer 270*a* form a MIM capacitor. Conductive layer 270*b* is electrically connected to conductive layer 170. Directly connecting conductive layer 270*b* to conductive layer 170, without an intervening conductive layer, for example conductive layer 186*b* in FIG. 6, allows for a higher degree of uniformity for insulating layer 178 by avoiding the need for an ion milling or back sputtering process prior to depositing an intervening conductive layer, and reduces plasma damage on insulating layer 178, which acts as a capacitor dielectric material. Additionally, manufacturing cost and time is reduced by avoiding formation of an intervening conductive layer such as conductive layer 186, shown in FIG. 6. The individual sections of conductive layer 270*c*-270*e* can be wound or coiled in plan-view to produce or exhibit the desired characteristics of an inductor.

Conductive layers 170, and 270, resistive layer 174, and insulating layers 160, 178, 260, and 276 constitute a plurality of passive circuit elements or IPDs 284 formed over semiconductor die 144. Semiconductor die 144 are singulated to create individual IPD die 282. IPD die 282 and semiconductor die 124 are mounted over a temporary carrier 288. An encapsulant 292 is formed over semiconductor die 124, semiconductor die 144, and carrier 288. Encapsulant 292 provides structural support and stiffness during RDL and bump formation. An insulating layer 300 is formed over encapsulant 292, semiconductor die 124, and IPD die 282. The thickness of insulating layer 300 can be adjusted according to the design and functionality of IPD die 282.

An electrically conductive layer 310 is formed over insulating layer 300, IPD die 282, and semiconductor die 124. Conductive layer 310 operates as a fan-out RDL, providing lateral redistribution for the electrical signals of semiconductor die 124 and IPD die 282. The individual portions of conductive layer 310*a*-310*d* can be electrically common or electrically isolated depending on the connectivity of the individual semiconductor die 124 and IPD die 282. Conductive layer 310*a* is electrically connected to conductive layer 132 of semiconductor die 124. Conductive layer 310*b* is electrically connected to conductive layer 132 of semiconductor die 124 and conductive layer 270*a* of IPD die 282. Conductive layer 310*c* is electrically connected to conductive layers 270*b* and 270*d*. A portion of conductive layer 310*c* extends horizontally along insulating layer 300, and operates as a stacked-inductor bridge or conductive bridge providing electrical interconnection between conductive layers 270*b* and 270*d*. Thus, conductive layer 310*c* is electrically connected to the inductor wing 270*c*-270*e* and semiconductor die 144. The distance or gap D2 between the horizontal portions of conductive layers 310*a*-310*d* and conductive layers 270*a*-270*e* can be controlled or adjusted by increasing or decreasing the thickness of insulating layer 300 according to the design and function of IPD die 282. Semiconductor packages, particularly in high-current applications, are prone to leakage current between conductive layers or devices. Increasing the distance D2 by increasing the thickness of insulating layer 300 provides the ability to reduce leakage current between conductive layers 310*a*-310*d* and the IPDs 284, semiconductor die 144, and semiconductor die 124.

Figure 11A:
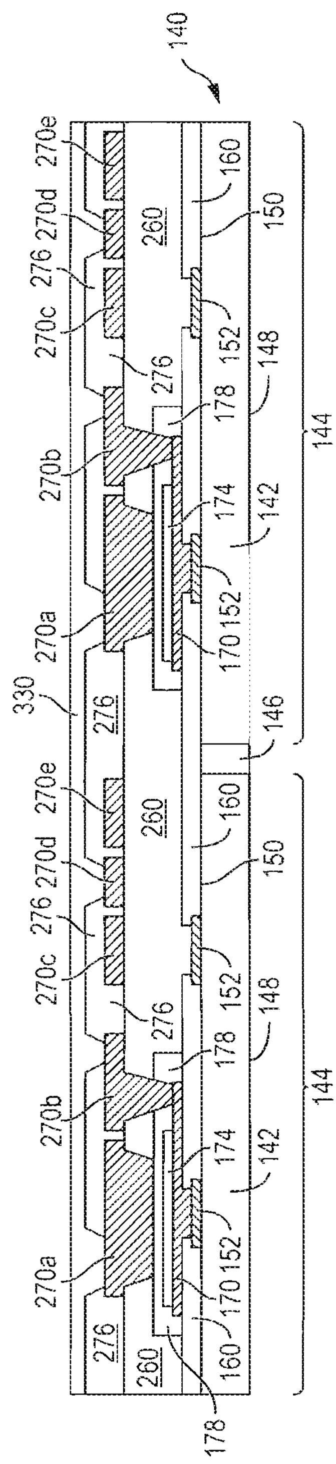
FIGS. 11*a*-11*b* illustrate a process of forming a temporary planarization layer over an IPD and a semiconductor die.
Figure 11B:
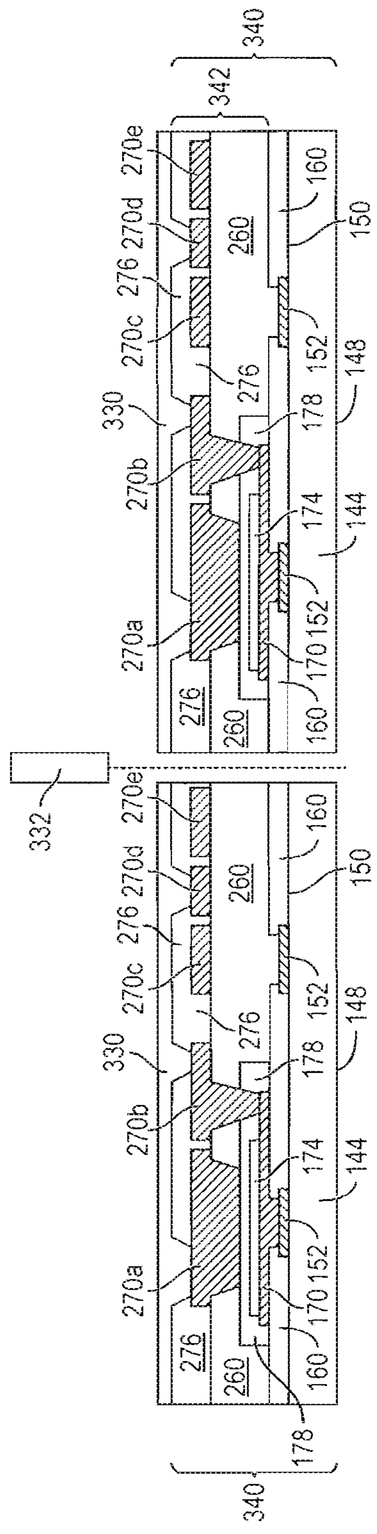

FIGS. 11*a*-11*b* illustrate, in relation to FIGS. 1, and 2*a*-2*c*, a process of forming a temporary planarization layer over an IPD and a semiconductor die. In FIG. 11*a*, continuing from FIG. 8*b*, a temporary planarization layer 330 is formed over insulating layer 276 and conductive layer 270 using spin coating, spray coating, printing, lamination, PVD, CVD, sintering, or thermal oxidation. In one embodiment, planarization layer 330 is applied as a blanket layer over the entire semiconductor wafer 140 without patterning. The planarization layer 330 contains one or more layers of SiO2, Si3N4, SiOn, Ta2O5, Al2O3, BCB, PI, PBO, polymer matrix dielectric film, organic polymer film, or other material having similar insulating or structural properties. In one embodiment, planarization layer 330 has a thickness of 1 μm. In FIG. 11*b*, the assembly is singulated through planarization layer 330, insulating layer 276, insulating layer 260, insulating layer 160, and saw street 146 with saw blade or laser cutting tool 332 to create individual IPD die 340 with planarization layer 330 formed over IPD die 340.

The structures described in FIGS. 4*c*-4*e*, 8*a*-8*b*, and 11*a*-11*b*, including conductive layers 170, and 270, resistive layer 174, and insulating layers 160, 178, 260, and 276 constitute a plurality of passive circuit elements or IPDs 342 formed within IPD die 340. The IPDs 342 provide the electrical characteristics needed for high frequency applications, such as resonators, high-pass filters, low-pass filters, band-pass filters, symmetric Hi-Q resonant transformers, and tuning capacitors. The IPDs 342 can be used as front-end wireless RF components, which can be positioned between the antenna and transceiver. The inductors can be hi-Q balun, transformer, or coil, operating up to 100 Gigahertz. In some applications, multiple baluns are formed on a same substrate, allowing multi-band operation. For example, two or more baluns are used in a quad-band for mobile phones or other GSM communications, each balun is dedicated for a frequency band of operation of the quad-band device. A typical RF system requires multiple IPDs and other high frequency circuits in one or more semiconductor packages to perform the necessary electrical functions.

Figure 12A:
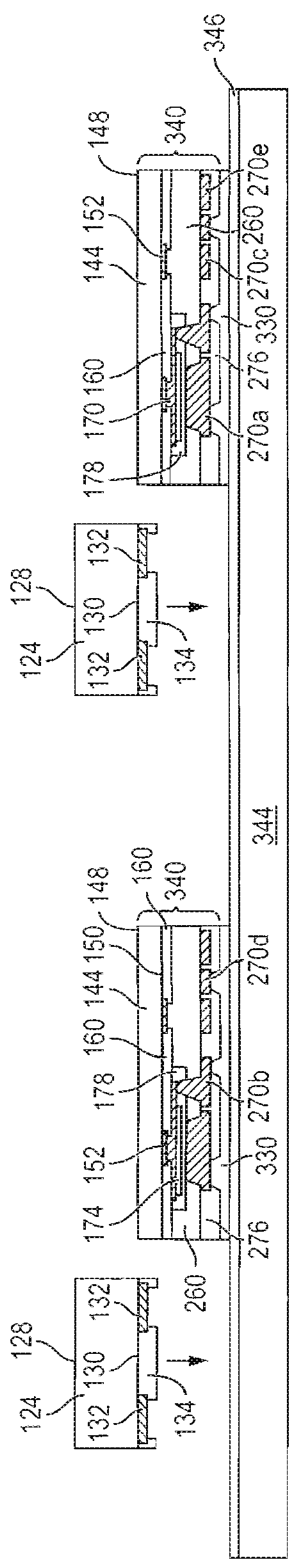
FIGS. 12*a*-12*h* illustrate a process of forming a Fo-WLCSP with a conductive bridge and an RDL formed over IPDs and semiconductor die with a vertical offset.

FIGS. 12*a*-12*h*, illustrate, in relation to FIGS. 1, and 2*a*-2*c*, a process of forming a Fo-WLCSP with a conductive bridge and an RDL formed over IPDs and semiconductor die with a vertical offset. In FIG. 12*a*, a substrate or carrier 344 contains sacrificial base material such as silicon, polymer, beryllium oxide, or other suitable low-cost, rigid material for structural support. An interface layer or double-sided tape 346 is formed over carrier 344 as a temporary adhesive bonding film or etch-stop layer. Leading with insulating layer 276, IPD die 340 from FIG. 11*b* are positioned over and mounted to carrier 344 with interface layer 346 using a pick and place operation. Leading with insulating layer 134, semiconductor die 124 from FIG. 3*c* are positioned over and mounted to carrier 344 with interface layer 346 using a pick and place operation. Because planarization layer 330 is formed over insulating layer 276, insulating layer 276 is vertically offset from insulating layer 134 by an amount equal to a thickness of planarization layer 330. Thus, insulating layer 276 and insulating layer 134 are non-planar. Additionally, IPD die 340 is vertically offset from insulating layer 134 of semiconductor die 124 by an amount equal to the thickness of planarization layer 330.

Figure 12B:
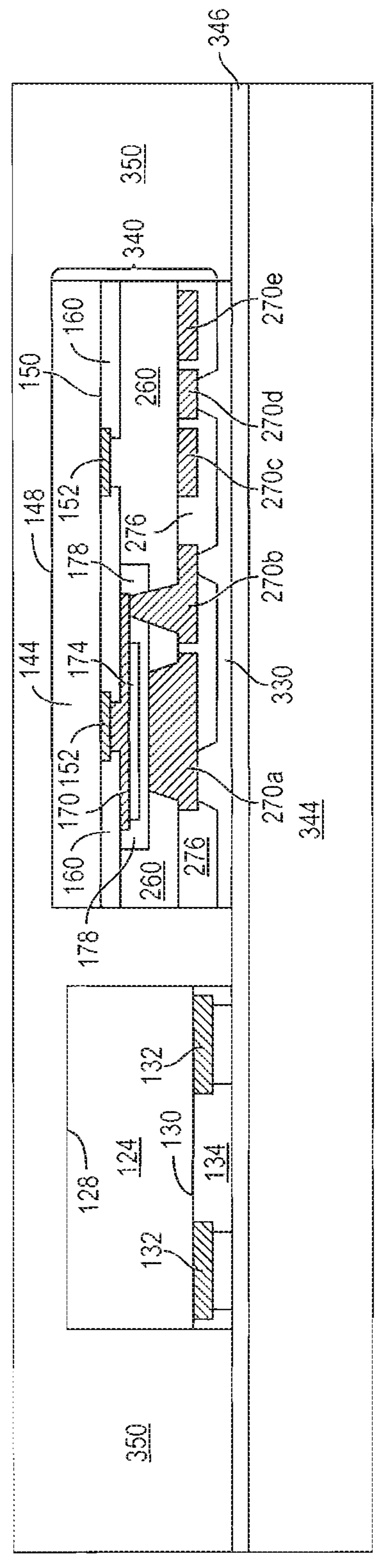

FIG. 12*b* shows the assembly from FIG. 12*a*, focusing on a single IPD die 340, and a single semiconductor die 124. An encapsulant or molding compound 350 is deposited over IPD die 340, semiconductor 124, and carrier 344 using a paste printing, compressive molding, transfer molding, liquid encapsulant molding, vacuum lamination, spin coating, or other suitable applicator. Encapsulant 350 can be polymer composite material, such as epoxy resin with filler, epoxy acrylate with filler, or polymer with proper filler. Encapsulant 350 is non-conductive and environmentally protects the semiconductor device from external elements and contaminants. Encapsulant 350 has high volume resistivity, (e.g., greater than E14 Ohm-cm), low dielectric constant (e.g., less than 4.0), and low loss tangent (e.g., less than 0.05).

Figure 12C:
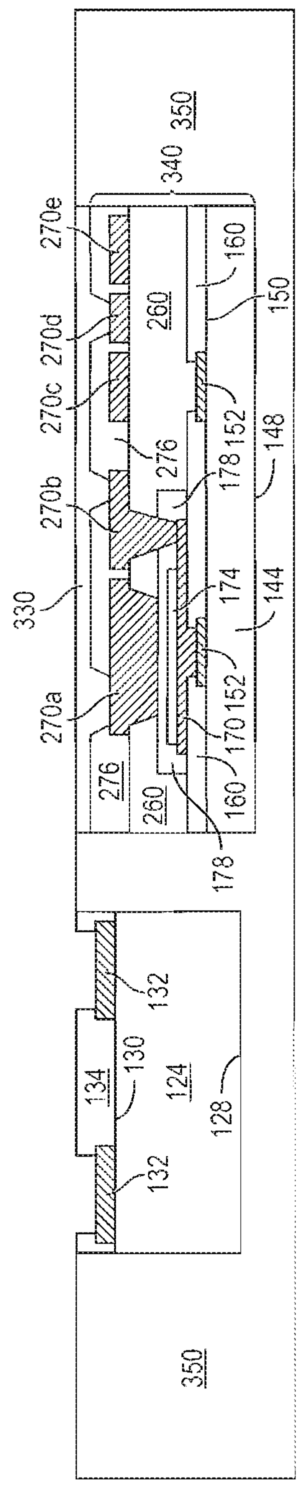

In FIG. 12*c*, carrier 344, and interface layer 346 are removed by chemical etching, mechanical peeling, CMP, mechanical grinding, thermal bake, UV light, laser scanning, or wet stripping to expose a surface of encapsulant 350, insulating layer 134, conductive layer 132, and planarization layer 330. Encapsulant 350 provides structural support for semiconductor die 124 and IPD die 340 after removal of carrier 344.

Figure 12D:
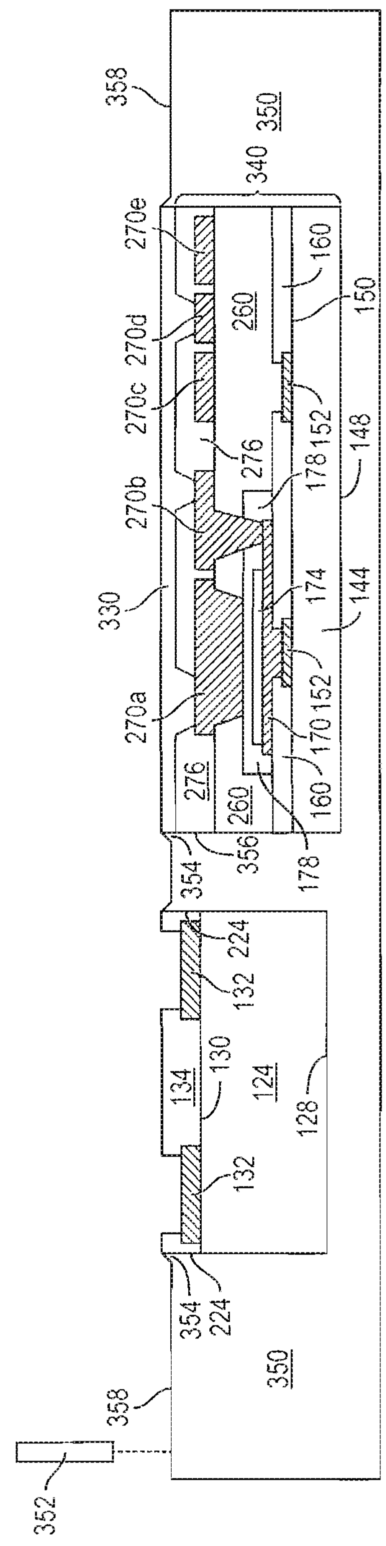

In FIG. 12*d*, encapsulant 350 is etched using a plasma process, wet chemical etching, or photoresist developing process to remove a portion of a surface of the encapsulant 280. Alternatively, a portion of encapsulant 350 is removed by LDA using laser 352. In one embodiment, a portion of the encapsulant 350, support structure 354, maintains coverage over a sidewall 224 of insulating layer 134. Support structure 354 also maintains coverage over a sidewall 356 of IPD die 340. Encapsulant 350 also has a surface 358 that is vertically offset from an exposed surface of insulating layer 134 and planarization layer 330.

Figure 12E:
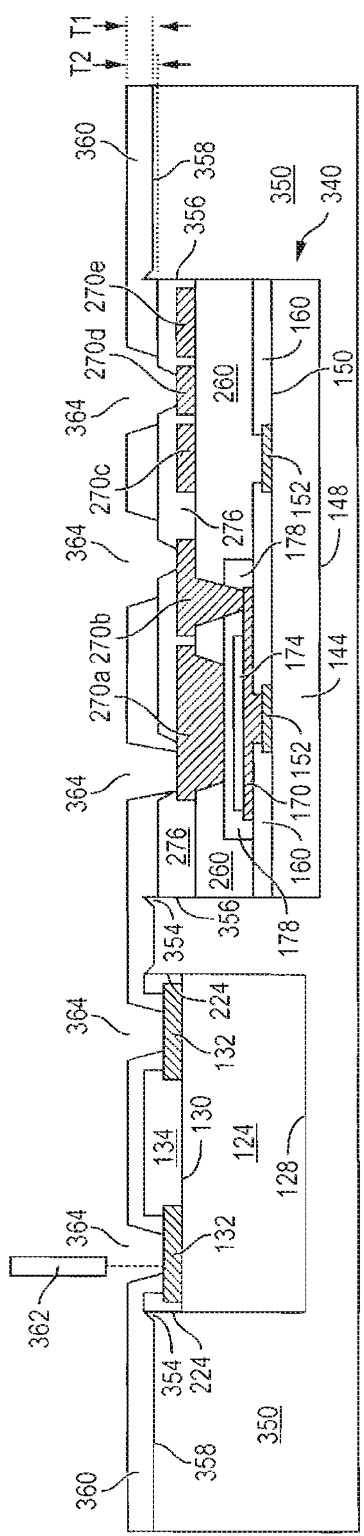

In. FIG. 12*e*, planarization layer 330 is removed by wet chemical stripping process, or an etching process with a patterned photoresist layer, to expose insulating layer 276 and conductive layer 270. An insulating or passivation layer 360 is formed over encapsulant 350, semiconductor die 124, and IPD die 340 using PVD, CVD, printing, spin coating, spray coating, screen printing or lamination. Insulating layer 360 contains one or more layers of SiO2, Si3N4, SiON, Ta2O5, Al2O3, organic polymer, or other material having similar insulating and structural properties.

The thickness of insulating layer 360 can be adjusted according to the design and function of IPD die 340. Insulating layer 360 has a first thickness T1 in a peripheral region or outside a footprint of IPD die 340. In one embodiment, thickness T1 of insulating layer 360 has a range between 5-25 μm. Insulating layer 360 has a second thickness T2 within a footprint of IPD die 340. Thickness T2 is greater than thickness T1 by an amount equal to the thickness of planarization layer 330. The thickness T2 of insulating layer 360 can be adjusted independently from, or in addition to, the thickness T1 of insulating layer 360, by increasing or decreasing the thickness of planarization layer 330 according to the design and function of the semiconductor device.

A portion of insulating layer 360 is removed by an etching process with a patterned photoresist layer to expose conductive layer 132 and conductive layer 270. Alternatively, a portion of insulating layer 360 is removed by LDA using laser 362 to expose conductive layer 132 and conductive layer 270. The resulting vias 364 can have a straight, sloped, angled, or stepped sidewall.

Figure 12F:
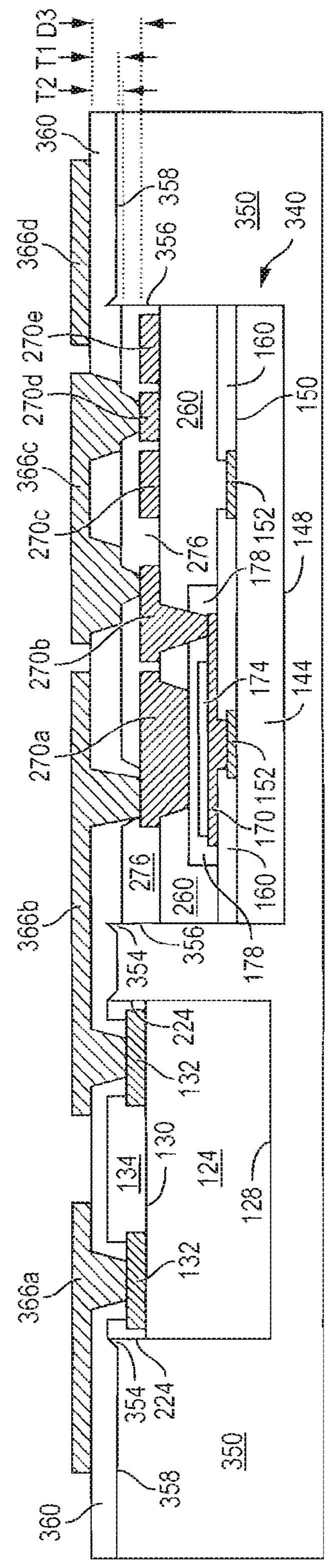

In FIG. 12*f*, an electrically conductive layer 366 is formed over insulating layer 360, insulating layer 276, insulating layer 134, conductive layer 132, and conductive layer 270 using patterning with PVD, CVD, sputtering, electrolytic plating, electroless plating process, or other suitable metal deposition process to form individual portions or sections 366*a*-366*d*. Conductive layer 366 can be one or more layers of Al, Cu, Sn, Ni, Au, Ag, or other suitable electrically conductive material. In one embodiment, a thickness of conductive layer 366 ranges between 3-12 μm. A portion of conductive layer 366 extends horizontally along insulating layer 360 and parallel to active surface 130 of semiconductor die 124 to laterally redistribute the electrical interconnect to conductive layers 132 and 270. Conductive layer 366 operates as a fan-out RDL, providing lateral redistribution for the electrical signals of semiconductor die 124 and IPD die 340. The individual portions of conductive layer 366*a*-366*d* can be electrically common or electrically isolated depending on the connectivity of the individual semiconductor die 124 and IPD die 340. A portion of conductive layer 366*a* extends through insulating layer 360 to electrically connect conductive layer 366*a* to conductive layer 132 of semiconductor die 124. A portion of conductive layer 366*b* extends through insulating layer 360 to electrically connect conductive layer 366*b* to conductive layer 132 of semiconductor die 124 and conductive layer 270*a* of IPD die 340.

A portion of conductive layer 366*c* extends through insulating layers 360 and 276 to electrically connect conductive layer 366*c* to conductive layers 270*b* and 270*d*. A portion of conductive layer 366*c* also extends horizontally along insulating layer 360, and operates as a stacked-inductor bridge or conductive bridge providing electrical interconnection between conductive layers 270*b* and 270*d*. Thus, conductive layer 366*c* is electrically connected to the inductor wing 270*c*-270*e* and semiconductor die 144. The distance or gap D3 between the horizontal portions of conductive layers 366*a*-366*d* and conductive layers 270*a*-270*e* can be controlled or adjusted by increasing or decreasing the thicknesses T1 and T2 of insulating layer 360 according to the design and function of IPD die 340. Semiconductor packages, particularly in high-current applications, are prone to leakage current between conductive layers or devices. Increasing the distance D3 by increasing the thicknesses T1 and T2 of insulating layer 360 provides the ability to reduce leakage current between conductive layers 366*a*-366*d* and the IPDs 342, semiconductor die 144, and semiconductor die 124.

Figure 12G:
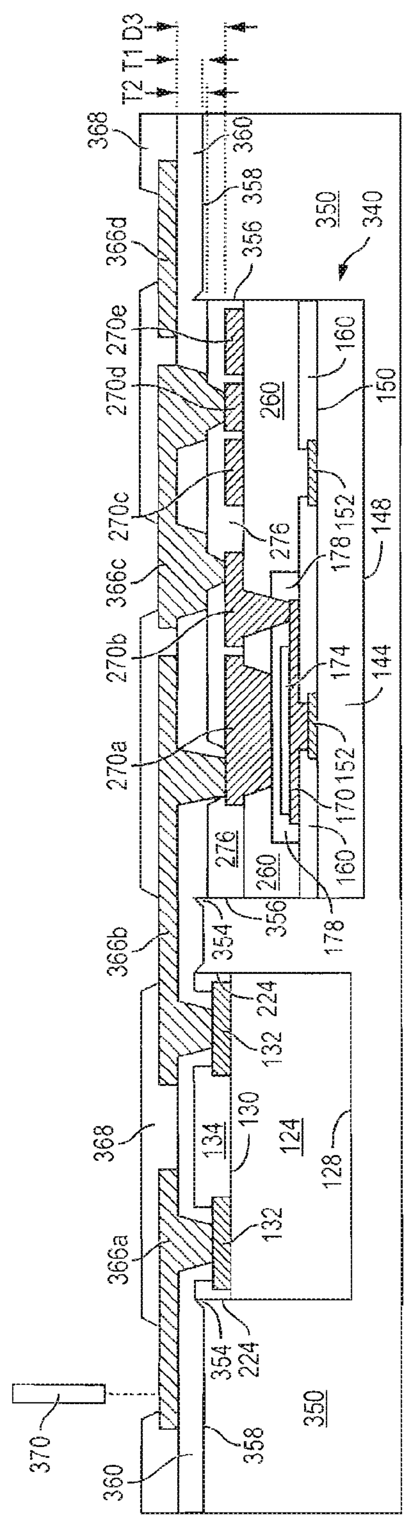

In FIG. 12*g*, an insulating or passivation layer 368 is formed over insulating layer 360 and conductive layer 366 using PVD, CVD, printing, spin coating, spray coating, screen printing or lamination. Insulating layer 368 contains one or more layers of SiO2, Si3N4, SiON, Ta2O5, Al2O3, organic polymer, or other material having similar insulating and structural properties. A portion of insulating layer 368 is removed by an etching process with a patterned photoresist layer to expose a portion of conductive layer 366. Alternatively, a portion of insulating layer 368 is removed by LDA using laser 370 to expose a portion of conductive layer 366.

Figure 12H:
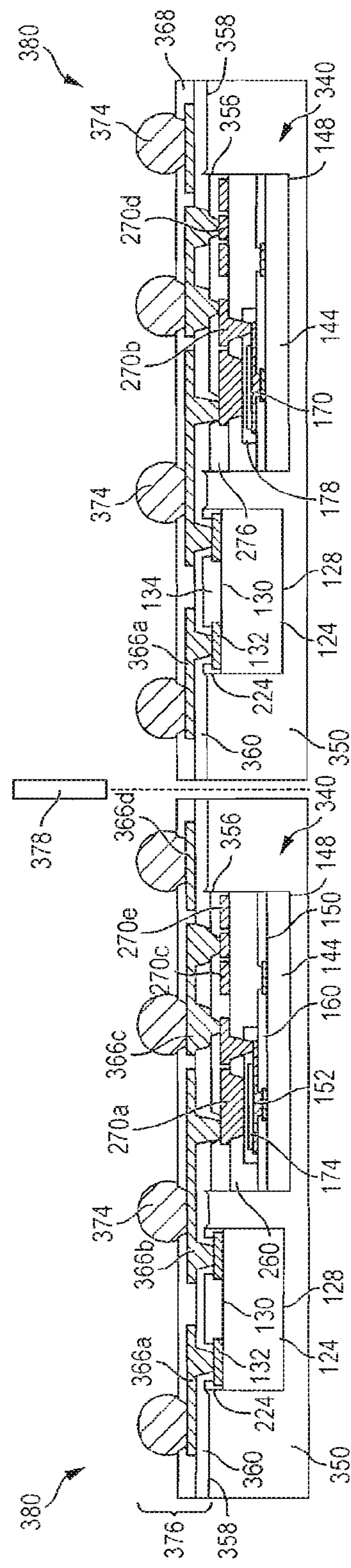

FIG. 12*h* shows the assembly from FIGS. 12*a*-12*g* with multiple IPD die 340 and semiconductor die 124. An electrically conductive bump material is deposited over the exposed portion of conductive layer 366 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 366 using a suitable attachment or bonding process. In one embodiment, the bump material is reflowed by heating the material above its melting point to form balls or bumps 374. In some applications, bumps 374 are reflowed a second time to improve electrical contact to conductive layer 366. A UBM layer can be formed under bumps 374. Bumps 374 can also be compression bonded to conductive layer 366. Bumps 374 represent one type of interconnect structure that can be formed over conductive layer 366. The interconnect structure can also use stud bump, micro bump, or other electrical interconnect.

Collectively, insulating layers 360, and 368, conductive layer 366, and bumps 374 constitute a build-up interconnect structure 376. Additional conductive and insulating layers may be formed over insulating layer 368 prior to forming bumps 374, to provide additional vertical and horizontal electrical connectivity across the package according to the design and functionality of the semiconductor device. The assembly from FIG. 12*h* is singulated through insulating layer 368, insulating layer 360, and encapsulant 350 with saw blade or laser cutting tool 378 to create individual semiconductor packages or Fo-WLCSP 380.

Figure 13:
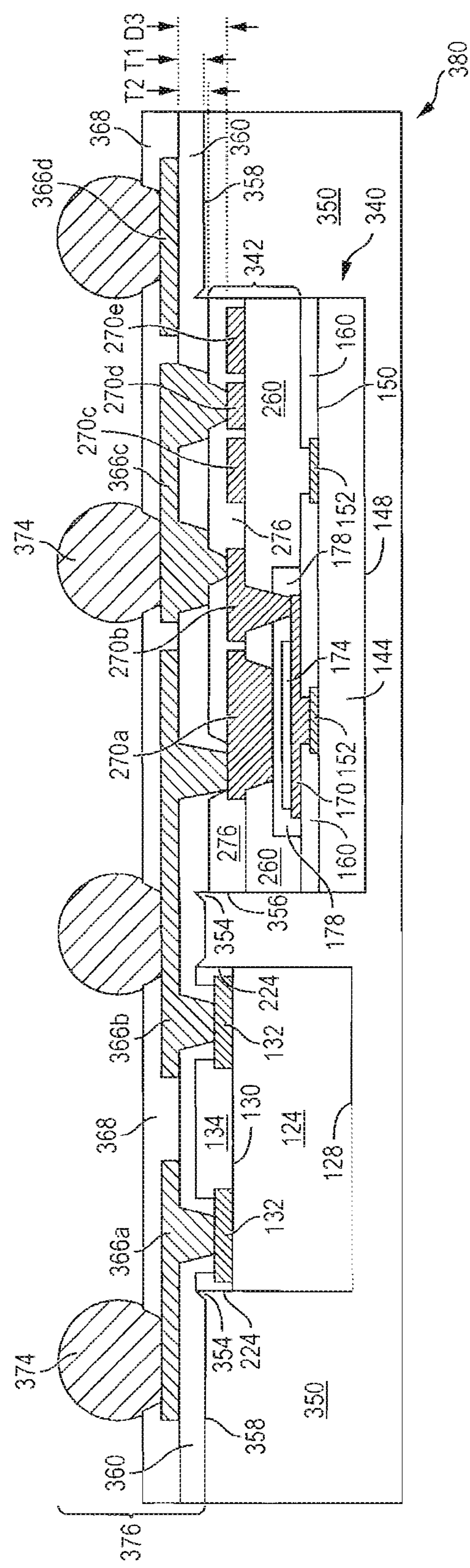
FIG. 13 illustrates a semiconductor package with a vertical offset between semiconductor die.

FIG. 13 shows Fo-WLCSP 380 after singulation. Fo-WLCSP 380 is similar to the assembly shown in FIG. 10, with a vertical offset between IPD die 340 and semiconductor die 124. Conductive layer 170, resistive layer 174, insulating layer 178, and conductive layer 270*a* form a MIM capacitor. Conductive layer 270*b* is electrically connected to conductive layer 170. Directly connecting conductive layer 270*b* to conductive layer 170 without an intervening conductive layer, for example, conductive layer 186*b* in FIG. 6, avoids the need for an ion milling or back sputtering process prior to depositing the intervening conductive layer, which allows for a higher degree of uniformity for insulating layer 178. Directly connecting conductive layer 270*b* to conductive layer 170 without an intervening conductive layer, for example, conductive layer 186*b* in FIG. 6, also reduces plasma damage on insulating layer 178, which acts as a capacitor dielectric material. The individual sections of conductive layer 270*c*-270*e* can be wound or coiled in plan-view to produce or exhibit the desired characteristics of an inductor.

Conductive layers 170, and 270, resistive layer 174, and insulating layers 160, 178, 260, and 276 constitute a plurality of passive circuit elements or IPDs 342 formed over semiconductor die 144. A temporary planarization layer 330 is formed over IPDs 342. Semiconductor die 144 are singulated to create individual IPD die 340. IPD die 340 and semiconductor die 124 are mounted over a temporary carrier 344. An encapsulant 350 is formed over semiconductor die 124, semiconductor die 144, and carrier 344. IPD die 340 is vertically offset from insulating layer 134 of semiconductor die 124 by an amount equal to the thickness of planarization layer 330. Encapsulant 350 provides structural support and stiffness during RDL and bump formation. An insulating layer 360 is formed over encapsulant 350, semiconductor die 124, and IPD die 340. The thickness of insulating layer 360 can be adjusted according to the design and functionality of IPD die 340.

An electrically conductive layer 366 is formed over insulating layer 360, IPD die 340 and semiconductor die 124. Conductive layer 366 operates as a fan-out RDL, providing lateral redistribution for the electrical signals of semiconductor die 124 and IPD die 340. The individual portions of conductive layer 366*a*-366*d* can be electrically common or electrically isolated depending on the connectivity of the individual semiconductor die 124 and IPD die 340. Conductive layer 366*a* is electrically connected to conductive layer 132 of semiconductor die 124. Conductive layer 366*b* is electrically connected to conductive layer 132 of semiconductor die 124 and conductive layer 270*a* of IPD die 340. Conductive layer 366*c* is electrically connected to conductive layers 270*b* and 270*d*. A portion of conductive layer 366*c* extends horizontally along insulating layer 360, and operates as a stacked-inductor bridge or conductive bridge providing electrical interconnection between conductive layers 270*b* and 270*d*. Thus, conductive layer 366*c* is electrically connected to the inductor wing 270*c*-270*e* and semiconductor die 144.

The distance or gap D3 between the horizontal portions of conductive layers 366*a*-366*d* and conductive layers 270*a*-270*e* can be controlled or adjusted by increasing or decreasing the thicknesses T1 and T2 of insulating layer 360 according to the design and function of IPD die 340. Semiconductor packages, particularly in high-current applications, are prone to leakage current between conductive layers or devices. Increasing the distance D3 by increasing the thicknesses T1 and T2 of insulating layer 360 provides the ability to reduce leakage current between conductive layers 366*a*-366*d* and the IPDs 342, semiconductor die 144, and semiconductor die 124.

In summary, a semiconductor device has a first semiconductor die (semiconductor die 144). A first inductor (bottom inductor wing 186*c*-186*d*) is formed over the first semiconductor die (semiconductor die 144). A second inductor (top inductor wing 196*c*-196*e*) is formed over the first inductor (bottom inductor wing 186*c*-186*d*) and aligned with the first inductor (bottom inductor wing 186*c*-186*d*). An insulating layer (insulating layer 230) is formed over the first semiconductor die (semiconductor die 144) and the first and second inductors (bottom inductor wing 186*c*-186*d*; top inductor wing 196*c*-196*e*). A conductive bridge (conductive layer 240*c*) is formed over the insulating layer (insulating layer 230) and electrically connected between the second inductor (top inductor wing 196*c*-196*e*) and the first semiconductor die (semiconductor die 144). The semiconductor device further includes a second semiconductor die (semiconductor die 124). A conductive layer (conductive layer 240*b*) is formed between the first and second semiconductor die (semiconductor die 144; semiconductor die 124). A capacitor (conductive layer 170, resistive layer 174, insulating layer 178, and conductive layer 186*b*) is formed over the first semiconductor die (semiconductor die 144). The insulating layer (insulating layer 290) can have a first thickness (thickness T1) outside a footprint of the first semiconductor die (semiconductor die 144) and a second thickness (thickness T2) greater than the first thickness (thickness T1) over a footprint of the first semiconductor die (semiconductor die 144). The thickness of the insulating layer (insulating layer 230) can range between 5 and 25 μm. An encapsulant (encapsulant 220) is formed over the first semiconductor die (semiconductor die 144).

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:

providing a first semiconductor die;

forming a first inductor over the first semiconductor die;

forming a second inductor over the first inductor and aligned with the first inductor;

forming an insulating layer over the first semiconductor die and the first and second inductors; and forming a conductive bridge over the insulating layer and electrically connected between the second inductor and the first semiconductor die.

2. The method of claim 1, further including:

providing a second semiconductor die; and forming a conductive layer between the first and second semiconductor die.

3. The method of claim 1, further including forming a capacitor over the first semiconductor die.

4. The method of claim 1, wherein the insulating layer has a first thickness outside a footprint of the first semiconductor die and a second thickness greater than the first thickness over a footprint of the first semiconductor die.

5. The method of claim 1, wherein a thickness of the insulating layer ranges between 5 and 25 micrometers.

6. The method of claim 1, further including forming an encapsulant over the first semiconductor die.

7. A method of making a semiconductor device, comprising:

providing a first semiconductor die;

forming a first conductive layer over the first semiconductor die;

forming an insulating layer over the first conductive layer; and forming a second conductive layer over the insulating layer and first conductive layer to form an inductor and a portion of a capacitor.

8. The method of claim 7, wherein a portion of the second conductive layer extends outside a footprint of the capacitor.

9. The method of claim 7, wherein the insulating layer has a first thickness outside a footprint of the first semiconductor die and a second thickness greater than the first thickness over a footprint of the first semiconductor die.

10. The method of claim 7, further including:

providing a second semiconductor die; and forming a third conductive layer between the first and second semiconductor die.

11. The method of claim 7, wherein a portion of the second conductive layer extends vertically through an opening in the insulating layer to contact the first conductive layer.

12. The method of claim 7, wherein a thickness of the insulating layer ranges between 5 and 25 micrometers.

13. The method of claim 7, further including forming an encapsulant over the first semiconductor die.

14. A method of making a semiconductor device, comprising:

providing a first semiconductor die;

forming a plurality of integrated passive devices (IPDs) over the first semiconductor die;

forming an insulating layer over the first semiconductor die and the IPDs; and forming a conductive bridge over the insulating layer and electrically connected between the IPDs and the first semiconductor die.

15. The method of claim 14, wherein forming the IPDs further includes:

forming a first inductor over the first semiconductor die; and forming a second inductor over the first inductor and aligned with the first inductor.

16. The method of claim 14, further including:

providing a second semiconductor die; and forming a conductive layer between the first and second semiconductor die.

17. The method of claim 14, further including forming a capacitor over the first semiconductor die.

18. The method of claim 14, wherein the insulating layer has a first thickness outside a footprint of the first semiconductor die and a second thickness greater than the first thickness over a footprint of the first semiconductor die.

19. The method of claim 14, wherein a thickness of the insulating layer ranges between 5 and 25 micrometers.

20. The method of claim 14, further including forming an encapsulant over the first semiconductor die.

21. A semiconductor device, comprising:

a first semiconductor die;

a first inductor formed over the first semiconductor die;

a second inductor formed over the first inductor and aligned with the first inductor;

an insulating layer formed over the first semiconductor die and the first and second inductors; and a conductive bridge formed over the insulating layer and electrically connected between the second inductor and the first semiconductor die.

22. The semiconductor device of claim 21, further including:

a second semiconductor die; and a conductive layer formed between the first and second semiconductor die.

23. The semiconductor device of claim 21, further including:

a capacitor formed over the first semiconductor die.

24. The semiconductor device of claim 21, wherein the insulating layer has a first thickness outside a footprint of the first semiconductor die and a second thickness greater than the first thickness over a footprint of the first semiconductor die.

25. The semiconductor device of claim 21, wherein a thickness of the insulating layer ranges between 5 and 25 micrometers.

26. A semiconductor device, comprising:

a first semiconductor die;

a first inductor formed over the first semiconductor die including a portion directly contacting the semiconductor die; and a second inductor formed over the first inductor to align with the first inductor.

27. The semiconductor device of claim 26, further including:

a second semiconductor die disposed over the first semiconductor die; and a conductive layer formed between the first and second semiconductor die.

28. The semiconductor device of claim 26, further including:

a capacitor formed over the first semiconductor die.

29. The semiconductor device of claim 26, further including an insulating layer formed over the first semiconductor die.

30. The semiconductor device of claim 29, wherein a thickness of the insulating layer ranges between 5 and 25 micrometers.

* * * * *